(12) United States Patent
Kim et al.

(10) Patent No.: US 11,980,060 B2
(45) Date of Patent: May 7, 2024

(54) PIXEL CIRCUIT HAVING INCREASED CAPACITANCE AND DISPLAY DEVICE INCLUDING THE SAME

(71) Applicant: Samsung Display Co., Ltd., Yongin-Si (KR)

(72) Inventors: Myeongho Kim, Hwaseong-si (KR); Yeonhong Kim, Hwaseong-si (KR); Jaybum Kim, Yongin-si (KR); Kyoung Seok Son, Seoul (KR); Sunhee Lee, Seoul (KR); Seungjun Lee, Suwon-si (KR); Seunghun Lee, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 126 days.

(21) Appl. No.: 17/494,892

(22) Filed: Oct. 6, 2021

(65) Prior Publication Data

US 2022/0173191 A1  Jun. 2, 2022

(30) Foreign Application Priority Data

Dec. 1, 2020   (KR) .......................... 10-2020-0166111

(51) Int. Cl.
  *H01L 29/08*  (2006.01)
  *H10K 59/121* (2023.01)
  *H10K 71/00*  (2023.01)
  *H10K 59/12*  (2023.01)

(52) U.S. Cl.
  CPC ..... *H10K 59/1216* (2023.02); *H10K 59/1213* (2023.02); *H10K 71/00* (2023.02); *H10K 59/1201* (2023.02)

(58) Field of Classification Search
  CPC .................. H10K 59/1213; H10K 59/1216
  USPC ............................................. 257/40
  See application file for complete search history.

(56) References Cited

U.S. PATENT DOCUMENTS

| 10,490,668 | B2  |    | 11/2019 | Noh et al.  |               |
|------------|-----|----|---------|-------------|---------------|
| 2019/0006521 | A1 | *  | 1/2019  | Noh ....... | H01L 27/1225  |
| 2019/0148472 | A1 | *  | 5/2019  | Jeon ...... | H10K 59/1216  |
|            |     |    |         |             | 257/40        |
| 2019/0252479 | A1 | *  | 8/2019  | Kang ...... | H10K 59/1216  |
| 2019/0355799 | A1 | *  | 11/2019 | Jeong ..... | H10K 59/1213  |
| 2020/0203393 | A1 | *  | 6/2020  | Hu ........ | H10K 59/122   |

FOREIGN PATENT DOCUMENTS

| KR | 10-2007-0072207 A |   | 7/2007 |              |
|----|-------------------|---|--------|--------------|
| TW | 538531 B          | * | 6/2003 | H01L 27/0805 |

* cited by examiner

*Primary Examiner* — Phuc T Dang
(74) *Attorney, Agent, or Firm* — Innovation Counsel LLP

(57) ABSTRACT

A display device includes a first lower electrode disposed on a base substrate, a first upper electrode disposed on the first lower electrode, overlapping the first lower electrode in a plan view, including a silicon semiconductor, and constituting a first capacitor together with the first lower electrode, a second lower electrode disposed on the first upper electrode, and a second upper electrode disposed on the second lower electrode, overlapping the second lower electrode in a plan view, including an oxide semiconductor, and constituting a second capacitor together with the second lower electrode.

24 Claims, 11 Drawing Sheets

PIXEL CIRCUIT HAVING INCREASED CAPACITANCE AND DISPLAY DEVICE INCLUDING THE SAME

This application claims priority to Korean Patent Application No. 10-2020-0166111, filed on Dec. 1, 2020, and all the benefits accruing therefrom under 35 U.S.C. § 119, the content of which in its entirety is herein incorporated by reference.

BACKGROUND

1. Field

Implementations of the inventive concept relate generally to a pixel circuit and a display device including the same.

2. Discussion of the Background

A display device includes a pixel structure, and the pixel structure includes a plurality of lines and electrodes. In order to drive the display device at a high frequency, the number of lines and the electrodes included in the pixel structure is increasing. In addition, in order to display an image having a high resolution in the display device, an area of the pixel structure needs to be reduced. Accordingly, a structure in which the lines and the electrodes are stacked on each other has been developed. At the same time, in order to increase a yield of the display device, an efficiency of a process of forming the wirings and the electrodes is required.

SUMMARY

Embodiments provide a pixel circuit.

Embodiments provide a display device including the pixel circuit.

A display device according to an embodiment may include a first lower electrode disposed on a base substrate, a first upper electrode disposed on the first lower electrode, overlapping the first lower electrode in a plan view, including a silicon semiconductor, and constituting a first capacitor together with the first lower electrode, a second lower electrode disposed on the first upper electrode, and a second upper electrode disposed on the second lower electrode, overlapping the second lower electrode in a plan view, including an oxide semiconductor, and constituting a second capacitor together with the second lower electrode.

According to an embodiment, the first lower electrode and the second upper electrode may be electrically connected to each other.

According to an embodiment, a high power voltage may be provided to the first lower electrode and the second upper electrode.

According to an embodiment, the first upper electrode and the second lower electrode may be electrically connected to each other.

According to an embodiment, the first lower electrode and the second lower electrode may include a same material.

According to an embodiment, the first lower electrode and the second lower electrode may include molybdenum.

According to an embodiment, the display device may further include a first active pattern disposed on a same layer as the first upper electrode and overlapping the second lower electrode in a plan view.

According to an embodiment, the display device may further include a first lower gate electrode disposed on a same layer as the first lower electrode and overlapping the second lower electrode in a plan view.

According to an embodiment, a gate signal may be provided to the first lower gate electrode and the second lower electrode.

According to an embodiment, the display device may further include a second active pattern disposed on a same layer as the second upper electrode and an upper gate electrode disposed on the second active pattern and overlapping the second active pattern in a plan view.

According to an embodiment, the first lower electrode and the first upper electrode may overlap the upper gate electrode in a plan view.

According to an embodiment, the first lower electrode and the first upper electrode may not overlap the upper gate electrode in a plan view.

According to an embodiment, the display device may further include a second lower gate electrode disposed on a same layer as the second lower electrode and overlapping the upper gate electrode in a plan view.

According to an embodiment, a gate signal may be provided to the upper gate electrode and the second lower gate electrode.

A display device according to another embodiment may include a first lower electrode disposed on a base substrate, an upper electrode disposed on the first lower electrode, overlapping the first lower electrode in a plan view, including a silicon semiconductor, and constituting a capacitor together with the first lower electrode, a first active pattern disposed on a same layer as the upper electrode, a second lower electrode disposed on the first active pattern and overlapping the first active pattern in a plan view, a second active pattern disposed on the second lower electrode and including an oxide semiconductor, and an upper gate electrode disposed on the second active pattern and overlapping the second active pattern in a plan view.

According to an embodiment, the display device may further include a first lower gate electrode disposed on a same layer as the first lower electrode and overlapping the second lower electrode in a plan view.

According to an embodiment, a gate signal may be provided to the second lower electrode and the first lower gate electrode.

According to an embodiment, the first lower electrode and the upper electrode may overlap the upper gate electrode in a plan view.

According to an embodiment, the first lower electrode and the upper electrode may not overlap the upper gate electrode in a plan view.

According to an embodiment, the display device may further include a second lower gate electrode disposed on a same layer as the second lower electrode and overlapping the upper gate electrode in a plan view.

According to an embodiment, a gate signal may be provided to the upper gate electrode and the second lower gate electrode.

A display device according to still another embodiment may include a first active pattern disposed on a base substrate and including a silicon semiconductor, a lower electrode disposed on the first active pattern, an upper electrode disposed on the lower electrode, overlapping the lower electrode in a plan view, including an oxide semiconductor, and constituting a capacitor together with the lower electrode, a second active pattern disposed on a same layer as the upper electrode, and an upper gate electrode disposed on the second active pattern.

According to an embodiment, the display device may further include a first lower gate electrode disposed under the first active pattern and overlapping the lower electrode in a plan view.

According to an embodiment, a gate signal may be provided to the lower electrode and the first lower gate electrode.

According to an embodiment, the display device may further include a second lower gate electrode disposed on a same layer as the lower electrode and overlapping the upper gate electrode in a plan view.

A pixel circuit according to an embodiment may include a first transistor including a first terminal, a second terminal, and a gate terminal, wherein the gate terminal is connected to a first node, a second transistor including a first terminal receiving a data voltage, a second terminal connected to the first terminal of the first transistor, and a gate terminal receiving a first gate signal, a first capacitor including a first terminal receiving a high power voltage and a second terminal connected to the first node, and a second capacitor connected in parallel with the first capacitor between the high power voltage and the first node.

According to an embodiment, the first transistor may further include a back-gate terminal connected to the first node.

According to an embodiment, the pixel circuit may further include a third transistor including a first terminal connected to the second terminal of the first transistor, a second terminal connected to the first node, a gate terminal receiving a second gate signal, and a back-gate terminal receiving the second gate signal.

According to an embodiment, the first transistor and the second transistor may be PMOS transistors and the third transistor may be an NMOS transistor.

A display device according to an embodiment may include a light emitting diode connected between a first power voltage line and a second power voltage line which supplies a voltage lower than that of the first power voltage line, a first transistor serially connected to the light emitting diode between the first power voltage line and the second power voltage line, the first transistor including a first gate electrode and a first active layer which includes a first source electrode and a first drain electrode, a second transistor connected between the first gate electrode and the first drain electrode of the first transistor, the second transistor including a second gate electrode which receives a gate signal and a second active layer which includes a second source electrode connected to the first drain electrode and a second drain electrode connected to the first gate electrode, the first capacitor including a first terminal connected to the first power voltage line and a second terminal connected to the first gate electrode, and a second capacitor, the second capacitor including a third terminal connected to the first power voltage line and a fourth terminal connected to the first gate electrode.

The first transistor may further include a first back-gate terminal connected to the first gate electrode and dispose on a same layer as the first terminal.

The first active layer and the second terminal may be disposed on a same layer and are formed of a same material.

The second transistor may further include a second back-gate terminal connected to the second gate electrode and dispose on a same layer as the first gate electrode.

The first terminal and the second terminal may not overlap the second gate electrode in a plan view.

The third terminal and the second active layer may be disposed on a same layer and are formed of a same material.

The first terminal and the second terminal may overlap the second gate electrode in a plan view.

Therefore, a display device according to embodiments of present inventive concept may include a first lower electrode, a first upper electrode, a second lower electrode, and a second upper electrode. Since the first lower electrode, the first upper electrode, the second lower electrode, and the second upper electrode are formed together with a gate electrode or an active pattern included in the display device, additional processes for forming the first lower electrode, the first upper electrode, the second lower electrode, and the second upper electrode may be omitted.

The first upper electrode may constitute the first capacitor together with the first lower electrode, and the second upper electrode may constitute the second capacitor together with the second lower electrode. Since the pixel circuit included in the display device includes the first and second capacitors connected in parallel, a margin equal to an amount of charge stored in the second capacitor may be secured. Accordingly, the insulating layer included in the display device may have a sufficient thickness, and the insulating layer may effectively insulate metal layers vertically stacked with the insulating layer interposed therebetween.

It is to be understood that both the foregoing general description and the following detailed description are for providing examples of the inventive concept and are intended to provide further explanation of the inventive concept as claimed.

BRIEF DESCRIPTION OF THE DRAWINGS

The accompanying drawings, which are included to provide a further understanding of the inventive concept and are incorporated in and constitute a part of this specification, illustrate embodiments of the inventive concept, and together with the description serve to explain the inventive concepts.

DETAILED DESCRIPTION

Illustrative, non-limiting embodiments will be more clearly understood from the following detailed description in conjunction with the accompanying drawings.

Figure 1:
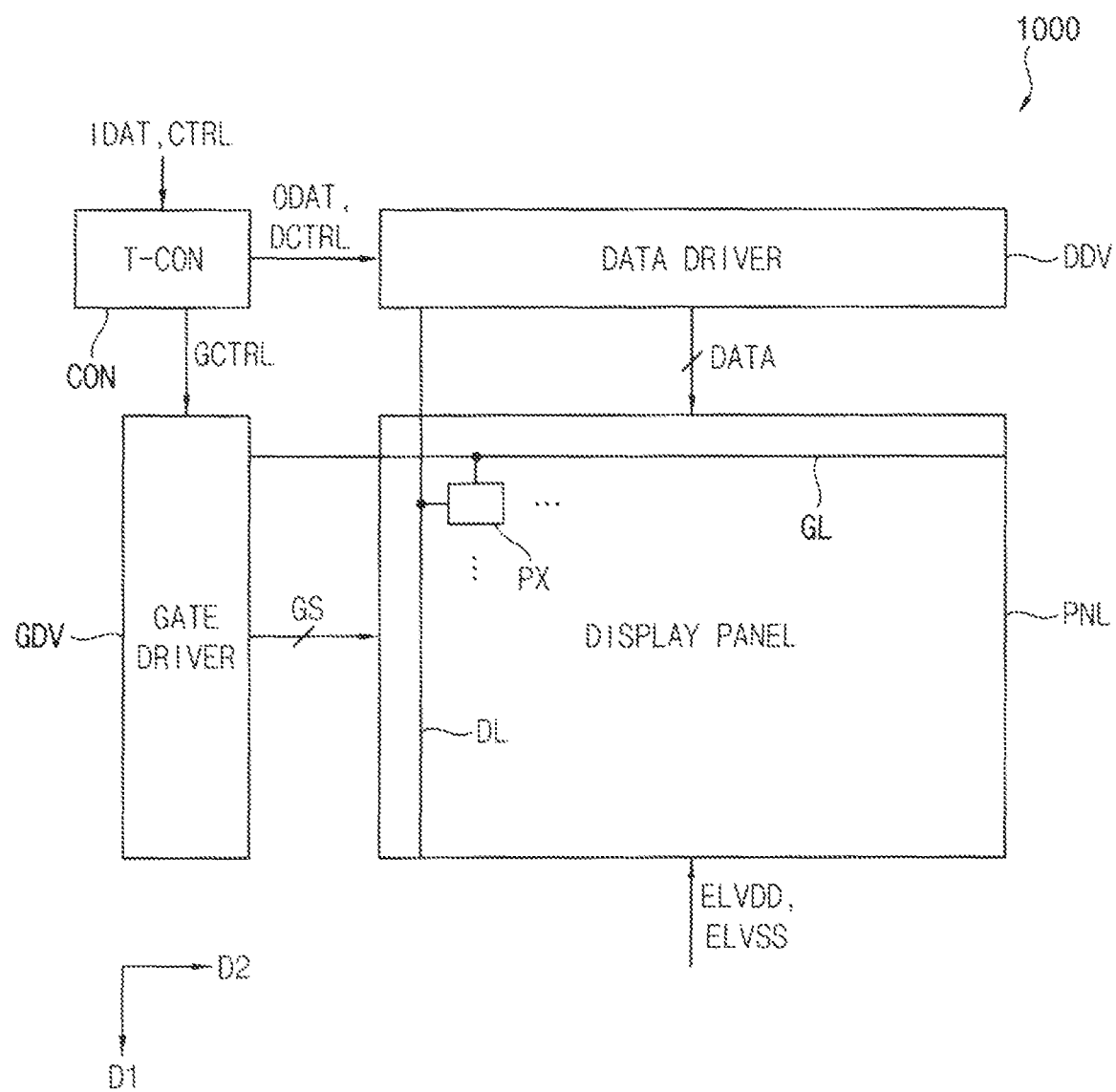
FIG. 1 is a block diagram illustrating a display device according to an embodiment.

FIG. 1 is a block diagram illustrating a display device according to an embodiment.

Referring to FIG. 1, a display device 1000 according to an embodiment of the present inventive concept may include a display panel PNL, a data driver DDV, a gate driver GDV, and a controller CON.

The display panel PNL may include data lines DL, gate lines GL, and pixel structures PX. The data lines DL may extend in a first direction D1 and may be spaced apart from each other in a second direction D2 crossing the first direction D1. The gate lines GL may extend in the second direction D2 and may be spaced apart from each other in the first direction D1. The pixel structure PX may be disposed in a region where one data line DL and one gate line GL intersect. The pixel structure PX may be electrically connected to the one data line DL and the one gate line GL. The pixel structure PX may receive a data voltage DATA, a gate signal GS, a high power voltage ELVDD, and a low power voltage ELVSS.

The data driver DDV may generate the data voltage DATA based on an output image data ODAT and a data control signal DCTRL received from the controller CON. The data voltage DATA may be provided to the pixel structure PX through the data line DL. For example, the data driver DDV may generate the data voltage DATA corresponding to the output image data ODAT and may output the data voltage DATA in response to the data control signal DCTRL. The data control signal DCTRL may include an output data enable signal, a horizontal start signal, and a load signal. In an embodiment, the data driver DDV may be electrically connected to the display panel PNL through one or more integrated circuits ("IC"s). In another embodiment, the data driver DDV may be mounted on the display panel PNL or may be integrated into a peripheral area of the display panel PNL.

The gate driver GDV may generate the gate signal GS based on a gate control signal GCTRL. The gate signal GS may be provided to the pixel structure PX through the gate line GL. For example, the gate signal GS may include a gate-on voltage for turning on a transistor and a gate-off voltage for turning off the transistor. The gate driver GDV may sequentially provide the gate-on voltage to the pixel structures PX through the gate lines GL. For example, the gate control signal GCTRL may include a vertical start signal, a clock signal, and the like. In an embodiment, the gate driver GDV may be integrated in the display panel when forming the pixel structure. The gate driver GDV may be directly mounted on the display panel PNL. In another embodiment, the gate driver GDV may be electrically connected to the display panel PNL in a form of chip-on-film ("COF").

The controller CON (e.g., a timing controller T-CON) may receive an input image data IDAT and a control signal CTRL from an external host processor (e.g., GPU). For example, the input image data IDAT may be RGB data including red image data, green image data, and blue image data. The control signal CTRL may include a vertical synchronization signal, a horizontal synchronization signal, an input data enable signal, a master clock signal, and the like. The controller CON may generate the gate control signal GCTRL, the data control signal DCTRL, and the output image data ODAT based on the input image data IDAT and the control signal CTRL.

Figure 2:
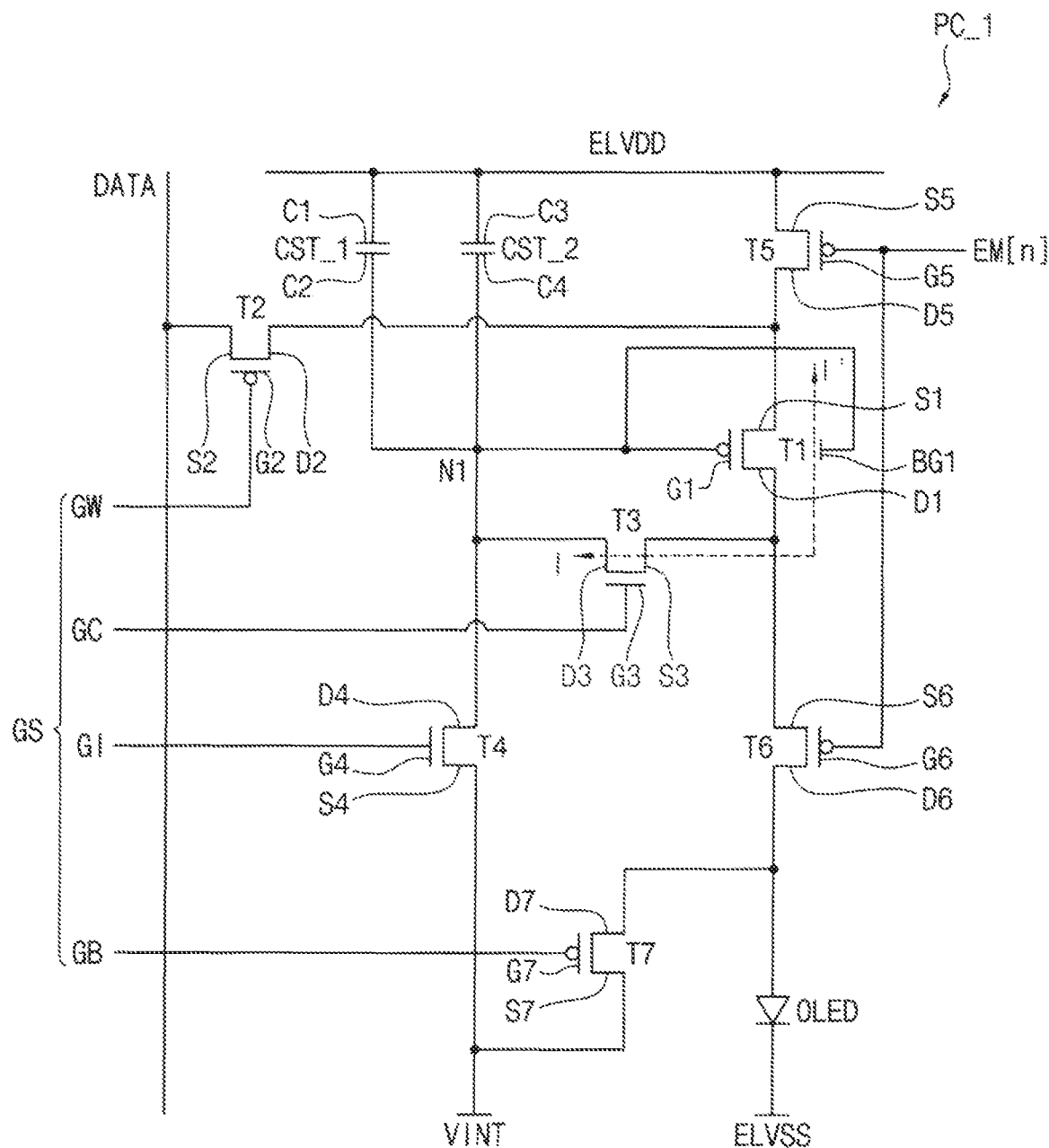
FIG. 2 is a circuit diagram illustrating an example of a pixel circuit included in the display device of FIG. 1.
Figure 3:
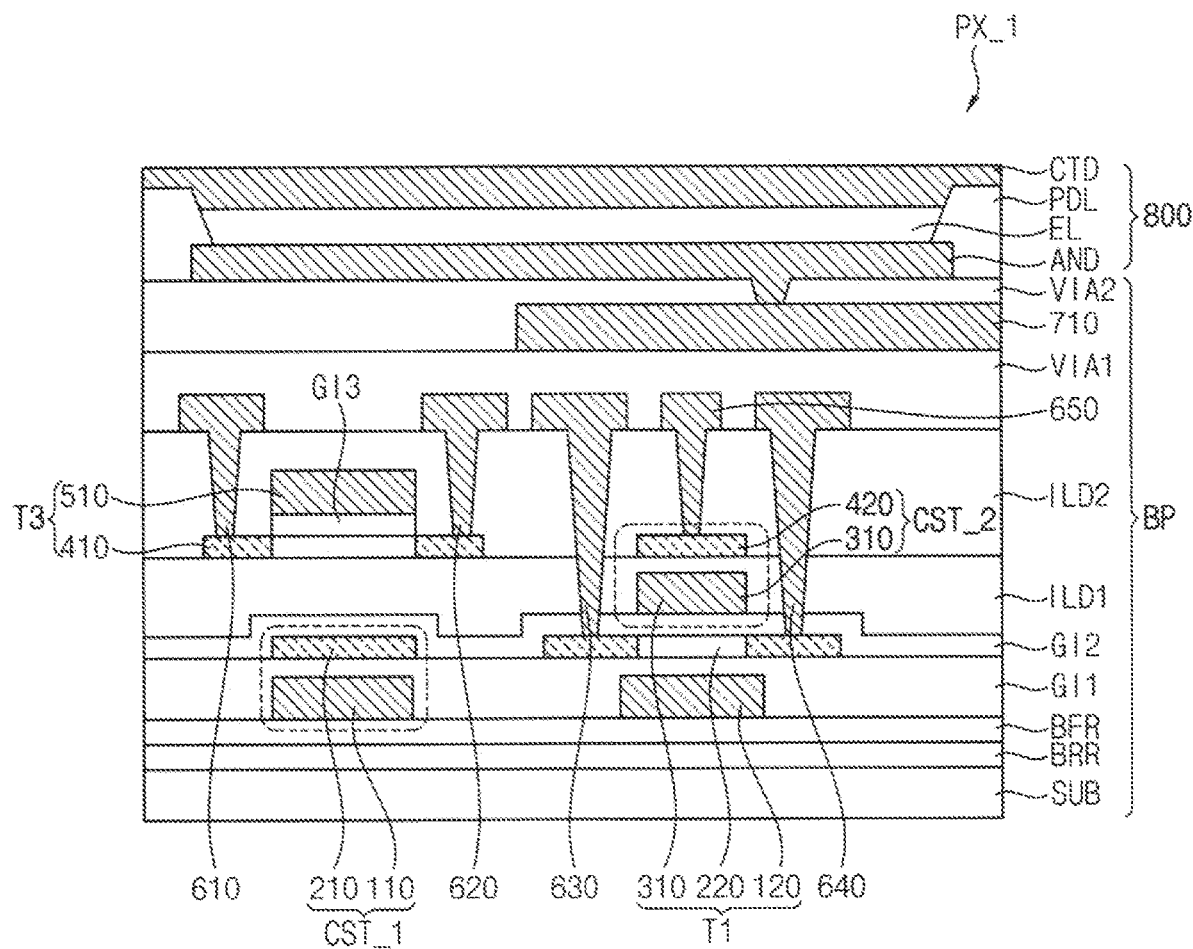
FIG. 3 is a cross-sectional view illustrating an example of a pixel structure included in the display device of FIG. 1.

FIG. 2 is a circuit diagram illustrating an example of a pixel circuit included in the display device of FIG. 1. FIG. 3 is a cross-sectional view illustrating an example of a pixel structure included in the display device of FIG. 1. For example, FIG. 3 is a cross-sectional view taken along line I-I' of FIG. 2.

Referring to FIGS. 1 and 2, a pixel circuit PC_1 included in the display device 1000 may include a first transistor T1, a second transistor T2, a third transistor T3, a fourth transistor T4, a fifth transistor T5, a sixth transistor T6, a seventh transistor T7, a first capacitor CST_1, a second capacitor CST_2, and an organic light emitting diode OLED. The first, second, fifth, sixth and seventh transistors T1, T2, T5, T6, and T7 may be PMOS transistors, and the third and fourth transistors T3 and T4 may be NMOS transistors.

In an embodiment, the first transistor T1 may include a source terminal S1, a drain terminal D1 connected to the organic light emitting diode OLED, a gate terminal G1 connected to a first node N1, and a back-gate terminal BG1 connected to the first node N1. The second transistor T2 may include a source terminal S2 receiving the data voltage DATA, a drain terminal D2 connected to the source terminal S1 of the first transistor T1, and a gate terminal G2 receiving a first gate signal GW. The third transistor T3 may include a source terminal S3 connected to the drain terminal D1 of the first transistor T1, a drain terminal D3 connected to the first node N1, and a gate terminal G3 receiving a second gate signal GC. The first capacitor CST_1 may include a first terminal C1 receiving the high power voltage ELVDD and a second terminal C2 connected to the first node N1. The second capacitor CST_2 may include a first terminal C3 receiving the high power voltage ELVDD and a second terminal C4 connected to the first node N1. For example, the first capacitor CST_1 and the second capacitor CST_2 may be connected in parallel between the high power voltage ELVDD and the first node N1.

The organic light emitting diode OLED may include a first terminal (e.g., an anode terminal) and a second terminal (e.g., a cathode terminal), the first terminal of the organic light emitting diode OLED may be connected to the first transistor T1 via the sixth transistor T6 to receive a driving current, and the second terminal may receive the low power voltage ELVSS. The organic light emitting diode OLED may emit light having a luminance corresponding to the driving current.

The first capacitor CST_1 may include the first terminal C1 and the second terminal C2. The first terminal C1 of the first capacitor CST_1 may receive the high power voltage ELVDD and the second terminal C2 of the first capacitor CST_1 may be connected to the first node N1. The first capacitor CST_1 may maintain a voltage level of the gate terminal G1 of the first transistor T1 during an inactive period of the first gate signal GW.

The second capacitor CST_2 may include the first terminal C3 and the second terminal C4. The first terminal C3 of the second capacitor CST_2 may receive the high power voltage ELVDD and the second terminal C4 of the second capacitor CST_2 may be connected to the first node N1. The second capacitor CST_2 may maintain the voltage level of the gate terminal G1 of the first transistor T1 during an inactive period of the first gate signal GW.

The first transistor T1 may include the gate terminal G1, the back-gate terminal BG1, the source terminal S1, and the drain terminal D1. The gate terminal G1 and the back-gate terminal BG1 of the first transistor T1 may be connected to the first node N1. Accordingly, the first transistor T1 may be implemented as a dual-gate transistor. The source terminal S1 of the first transistor T1 may be connected to the second transistor T2 to receive the data voltage DATA. The drain terminal D1 of the first transistor T1 may be connected to the organic light emitting diode OLED via the sixth transistor T6. The first transistor T1 may generate the driving current based on a voltage difference between the gate terminal G1 and the source terminal S1. For example, the first transistor T1 may be referred to as a driving transistor.

The second transistor T2 may include the gate terminal G2, the source terminal S2, and the drain terminal D2. The gate terminal G2 of the second transistor T2 may receive the first gate signal GW through the gate line GL.

The second transistor T2 may be turned on or off in response to the first gate signal GW. For example, when the second transistor T2 is a PMOS transistor, the second transistor T2 may be turned off when the first gate signal GW has a positive voltage level, and the second transistor T2 may be turned on when the first gate signal GW has a negative voltage level. The source terminal S2 of the second transistor T2 may receive the data voltage DATA through the data line DL. The drain terminal D2 of the second transistor T2 may provide the data voltage DATA to the source terminal S1 of the first transistor T1 while the second transistor T2 is turned on. For example, the second transistor T2 may be referred to as a switching transistor.

The third transistor T3 may include the gate terminal G3, the source terminal S3, and the drain terminal D3. The gate terminal G3 of the third transistor T3 may receive the second gate signal GC. The source terminal S3 of the third transistor T3 may be connected to the drain terminal D1 of the first transistor T1. The drain terminal D3 of the third transistor T3 may be connected to the first node N1.

The third transistor T3 may be turned on or off in response to the second gate signal GC. For example, when the third transistor T3 is an NMOS transistor, the third transistor T3 may be turned on when the second gate signal GC has a positive voltage level, and the third transistor T3 may be turned off when the gate signal GC has a negative voltage level.

During a period in which the third transistor T3 is turned on in response to the second gate signal GC, the third transistor T3 may diode-connect the first transistor T1. Since the first transistor T1 is diode-connected, a voltage difference corresponding to a threshold voltage of the first transistor T1 may occur between the gate terminal G1 of the first transistor T1 and the source terminal S1 of the first transistor T1. Accordingly, the data voltage DATA compensated by the threshold voltage may be provided to the gate terminal of the first transistor T1. Therefore, the third transistor T3 may compensate for the threshold voltage of the first transistor T1. For example, the third transistor T3 may be referred to as a compensation transistor.

The fourth transistor T4 may include a gate terminal G4, a source terminal S4, and a drain terminal D4. The gate terminal G4 of the fourth transistor T4 may receive a third gate signal GI. The source terminal S4 of the fourth transistor T4 may receive an initialization voltage VINT. The drain terminal D4 of the fourth transistor T4 may be connected to the gate terminal G1 of the first transistor T1.

The fourth transistor T4 may be turned on or off in response to the third gate signal GI. For example, when the fourth transistor T4 is an NMOS transistor, the fourth transistor T4 may be turned on when the third gate signal GI has a positive voltage level and the fourth transistor T4 may be turned off when the gate signal GI has a negative voltage level.

During a period in which the fourth transistor T4 is turned on in response to the third gate signal GI, the initialization voltage VINT may be provided to the gate terminal G1 of the first transistor T1. Accordingly, the fourth transistor T4 may initialize the gate terminal G1 of the first transistor T1 to the initialization voltage VINT. For example, the fourth transistor T4 may be referred to as an initialization transistor.

The fifth transistor T5 may include a gate terminal G5, a source terminal S5, and a drain terminal D5. The gate terminal G5 of the fifth transistor T5 may receive an emission control signal EM. The source terminal S5 of the fifth transistor T5 may receive the high power voltage ELVDD. The drain terminal D5 of the fifth transistor T5 may be connected to the source terminal S1 of the first transistor T1. When the fifth transistor T5 is turned on in response to the emission control signal EM, the fifth transistor T5 may provide the high power voltage ELVDD to the first transistor T1.

The sixth transistor T6 may include a gate terminal G6, a source terminal S6, and a drain terminal D6. The gate terminal G6 of the sixth transistor T6 may receive the emission control signal EM. The source terminal S6 of the sixth transistor T6 may be connected to the drain terminal D1 of the first transistor T1. The drain terminal D6 of the sixth transistor T6 may be connected to the first terminal of the organic light emitting diode OLED. When the sixth transistor T6 is turned on in response to the emission control signal EM, the sixth transistor T6 may provide the driving current to the organic light emitting diode OLED.

The seventh transistor T7 may include a gate terminal G7, a source terminal S7, and a drain terminal D7. The gate terminal G7 of the seventh transistor T7 may receive a fourth gate signal GB. The source terminal S7 of the seventh transistor T7 may receive the initialization voltage VINT. The drain terminal D7 of the seventh transistor T7 may be connected to the first terminal of the organic light emitting diode OLED. When the seventh transistor T7 is turned on in response to the fourth gate signal GB, the seventh transistor T7 may provide the initialization voltage VINT to the organic light emitting diode OLED. Accordingly, the seventh transistor T7 may initialize the first terminal of the organic light emitting diode OLED to the initialization voltage VINT. For example, the seventh transistor T7 may be referred to as an initialization transistor.

Meanwhile, a connection structure of the pixel circuit PC_1 shown in FIG. 2 is an example and may be variously changed. For example, the pixel circuit PC_1 may further include a boosting capacitor including a first terminal connected to the first node N1 and a second terminal receiving the first gate signal GW. The boosting capacitor may compensate for a voltage drop of the gate terminal G1 by increasing a voltage of the gate terminal G1 of the first transistor T1 when the provision of the first gate signal GW is stopped. Alternatively, the pixel circuit PC_1 may include a seventh transistor T7 to which an anode initialization voltage is provided to the source terminal S7. The anode initialization voltage is a voltage different from the above-described initialization voltage VINT, and the first terminal of the organic light emitting diode OLED may be initialized to the anode initialization voltage.

Referring to FIGS. 1, 2, and 3, a pixel structure PX_1 may be an example of the pixel structure PX illustrated in FIG. 1. The pixel structure PX_1 may include a transistor substrate BP and an organic light emitting structure 800. The transistor substrate BP may include a base substrate, a first lower electrode 110, a first lower gate electrode 120, a first gate insulating layer GIL a first upper electrode 210, a first active pattern 220, a second gate insulating layer GI2, a second lower electrode 310, a first interlayer insulating layer ILD1, a second active pattern 410, a second upper electrode 420, a third gate insulating layer GI3, an upper gate electrode 510, a second interlayer insulating layer ILD2, a first connection pattern 610, a second connection pattern 620, a third connection pattern 630, a fourth connection pattern 640, a fifth connection pattern 650, a first via insulating layer VIA1, a sixth connection pattern 710, and a second via insulating layer VIA2. For example, the base substrate may include a substrate SUB, a barrier layer BRR, and a buffer layer BFR. In addition, the base substrate may have a structure in which a plurality of substrates and a plurality of barrier layers are alternately stacked. The organic light emitting structure 800 may include a first electrode AND, an emission layer EL, and a second electrode CTD.

In an embodiment, the first lower electrode 110 and the first upper electrode 210 may constitute the first capacitor CST_1. For example, the first lower electrode 110 may correspond to the first terminal C1 of the first capacitor CST_1 and the first upper electrode 210 may correspond to the second terminal C2 of the first capacitor CST_1.

In an embodiment, the second lower electrode 310 and the second upper electrode 420 may constitute the second capacitor CST_2. For example, the second lower electrode 310 may correspond to the second terminal C4 of the second capacitor CST_2 and the second upper electrode 420 may correspond to the first terminal C3 of the second capacitor CST_2.

In an embodiment, the first lower gate electrode 120, the first active pattern 220, and the second lower electrode 310 may constitute the first transistor T1. For example, the first lower gate electrode 120 may correspond to the back-gate terminal BG1 of the first transistor T1 and the second lower electrode 310 may correspond to the gate terminal G1 of the first transistor T1. The first lower gate electrode 120 and the second lower electrode 310 may overlap each other.

In an embodiment, the second active pattern 410 and the upper gate electrode 510 may constitute the third transistor T3. For example, the upper gate electrode 510 may correspond to the gate terminal G3 of the third transistor T3.

In an embodiment, the first lower electrode 110, the first upper electrode 210, the second active pattern 410, and the upper gate electrode 510 may overlap each other in a plan view.

As described above, the first electrode AND included in the organic light emitting structure 800 may correspond to the first terminal of the organic light emitting diode OLED and the second electrode CTD may correspond to the second terminal of the organic light emitting diode OLED.

FIG. 4 to FIG. 9 are cross-sectional views illustrating a method of manufacturing the pixel structure of FIG. 3.

Figure 4:
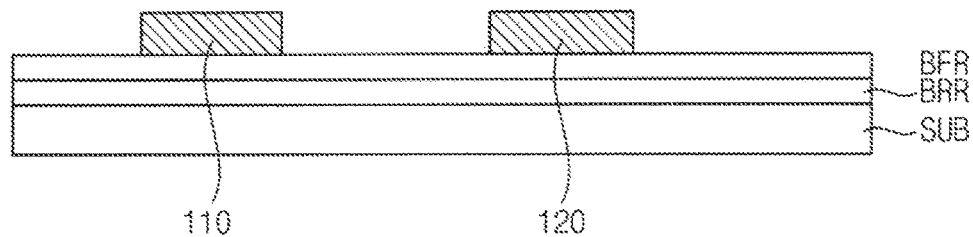
FIGS. 4, 5, 6, 7, 8 and FIG. 9 are cross-sectional views illustrating a method of manufacturing the pixel structure of FIG. 3.

Referring to FIGS. 3 and 4, the substrate SUB may include glass, quartz, plastic, or the like. In an embodiment, the substrate SUB may be a plastic substrate including plastic. For example, the plastic may be an organic material including polyimide. The barrier layer BRR may be disposed on the substrate SUB. The barrier layer BRR may include an inorganic material such as silicon oxide, silicon nitride, or amorphous silicon. The buffer layer BFR may be disposed on the barrier layer BRR. For example, the buffer layer BFR may include an inorganic material such as silicon oxide, silicon nitride, titanium oxide, tantalum oxide, and amorphous silicon. The buffer layer BFR may prevent diffusion of metal atoms or impurities from the substrate SUB into the first active pattern 220. In addition, the buffer layer BFR may control a heat transfer rate during a crystallization process for forming the first active pattern 220.

The first lower electrode 110 may be disposed on the buffer layer BFR. In an embodiment, the first lower electrode 110 may include a metal, an alloy, a conductive metal oxide, a transparent conductive material, and the like. For example, the first lower electrode 110 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The first lower gate electrode 120 may be disposed on the buffer layer BFR. For example, the first lower gate electrode 120 may be formed together with the first lower electrode 110 and may be disposed on the same layer as the first lower electrode 110. In an embodiment, the first lower gate electrode 120 may include a metal, an alloy, a conductive metal oxide, a transparent conductive material, or the like. For example, the first lower gate electrode 120 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

Since the first lower electrode 110 is disposed on the same layer as the first lower gate electrode 120, the first lower electrode 110 may be formed together with the first lower gate electrode 120. Accordingly, a number of processes for forming the first lower electrode 110 and the first lower gate electrode 120 may be minimized.

Figure 5:
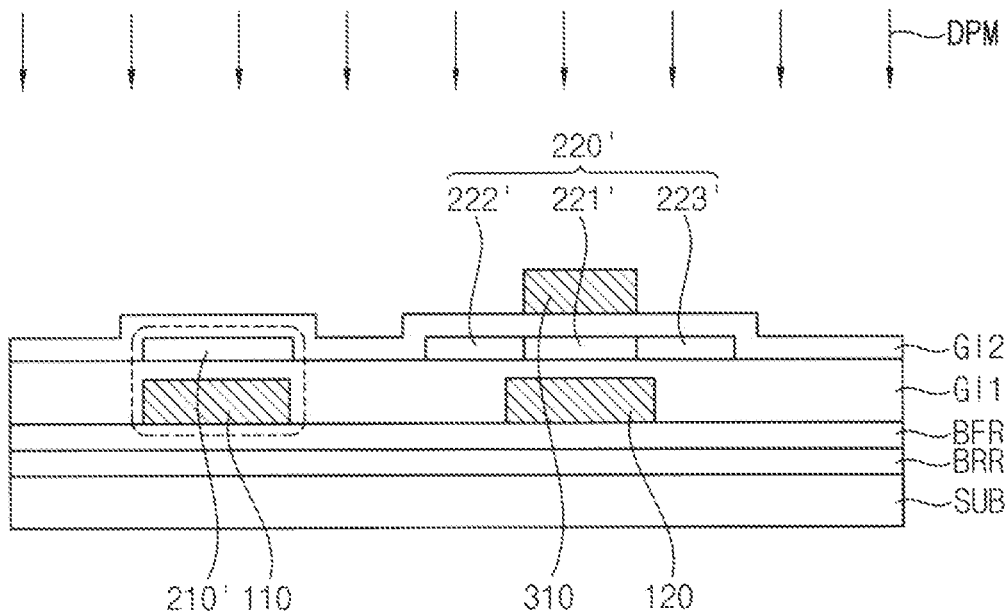
Figure 6:
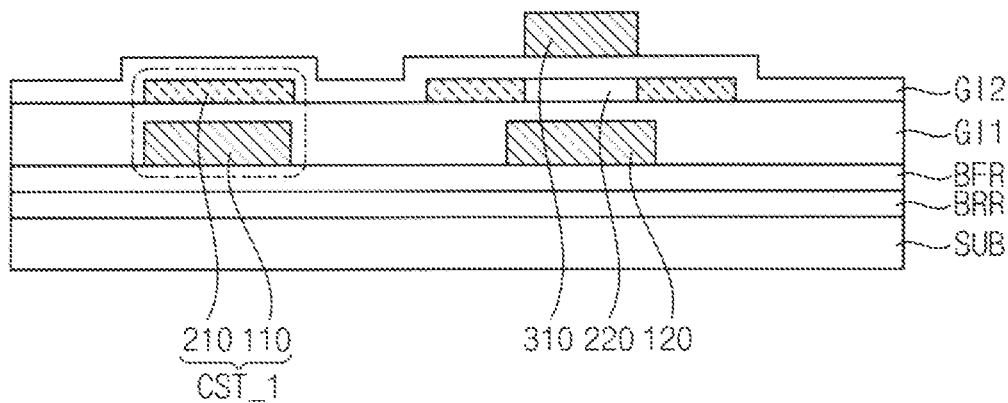

Referring to FIGS. 3, 5, and 6, the first gate insulating layer GI1 may be disposed on the buffer layer BFR. The first gate insulating layer GI1 may cover the first lower electrode 110 and the first lower gate electrode 120. Meanwhile, a thickness of the first gate insulating layer GI1 may correspond to a thickness of the first lower electrode 110. Accordingly, as the thickness of the first lower electrode 110 decreases, the thickness of the first gate insulating layer GI1 may decrease. For example, when the first lower electrode 110 may include a metal having a relatively small resistance, the thickness of the first lower electrode 110 may be reduced. Accordingly, the thickness of the first gate insulating layer GI1 may be reduced.

A preliminary first upper electrode 210' may be disposed on the first gate insulating layer GI1. In an embodiment, the preliminary first upper electrode 210' may include a silicon semiconductor. For example, the preliminary first upper electrode 210' may include amorphous silicon, polycrystalline silicon, or the like. When the preliminary first upper electrode 210' is doped with a doping material DPM, the first upper electrode 210 having a conductivity may be formed.

A preliminary first active pattern 220' may be disposed on the first gate insulating layer GI1. In an embodiment, the preliminary first active pattern 220' may include a silicon semiconductor such as amorphous silicon or polycrystalline silicon. For example, the preliminary first active pattern 220' may be formed together with the preliminary first upper electrode 210' and may be disposed in the same layer as the preliminary first upper electrode 210'. Accordingly, an additional process for forming an upper electrode corresponding to the second terminal C2 of the first capacitor CST_1 may be omitted.

The preliminary first active pattern 220' may include a channel region 221', a source region 222', and a drain region 223'.

The second gate insulating layer GI2 may be disposed on the first gate insulating layer GI1. The second gate insulating layer GI2 may cover the first upper electrode 210 and the second active pattern 220. In an embodiment, the second gate insulating layer GI2 may include an insulating material.

The second lower electrode 310 may be disposed on the second gate insulating layer GI2. In an embodiment, the second lower electrode 310 may include a metal, an alloy, a conductive metal oxide, a transparent conductive material, or the like. For example, the second lower electrode 310 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

In an embodiment, the second lower electrode 310, the channel region 221', and the first lower gate electrode 120 may overlap each other in a plan view. When the first preliminary upper electrode 210' and the first preliminary active pattern 220' are doped, the second lower electrode 310 may serve as an etching mask. For example, the channel region 221' overlapping the second lower electrode 310 may not be doped. The preliminary first upper electrode 210', the source region 222', and the drain region 223' which do not overlap the second lower electrode 310 may be doped. The doping material DPM may be selectively doped into the preliminary first upper electrode 210' and the preliminary first active pattern 220' which is not covered by the second lower electrode 310. For example, the preliminary first upper electrode 210' and the source region 222' and the drain region 223' of the preliminary first active pattern 220' may be doped with the doping material DPM. By doping with the doping material DPM, the first upper electrode 210 and the first active pattern 220 may be formed.

Figure 7:
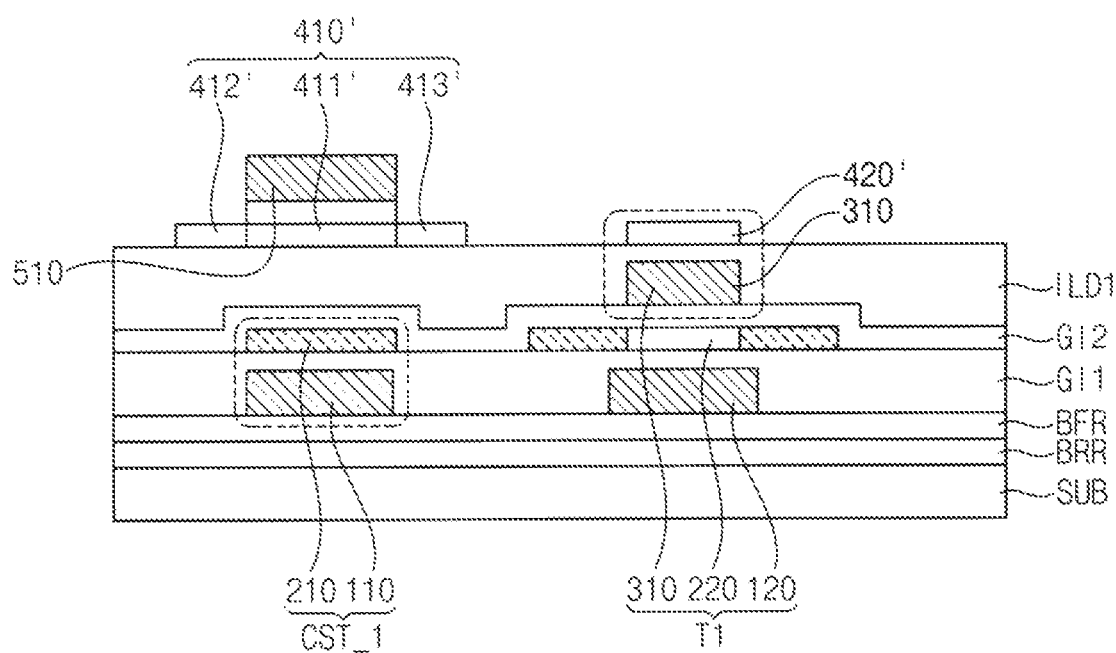
Figure 8:
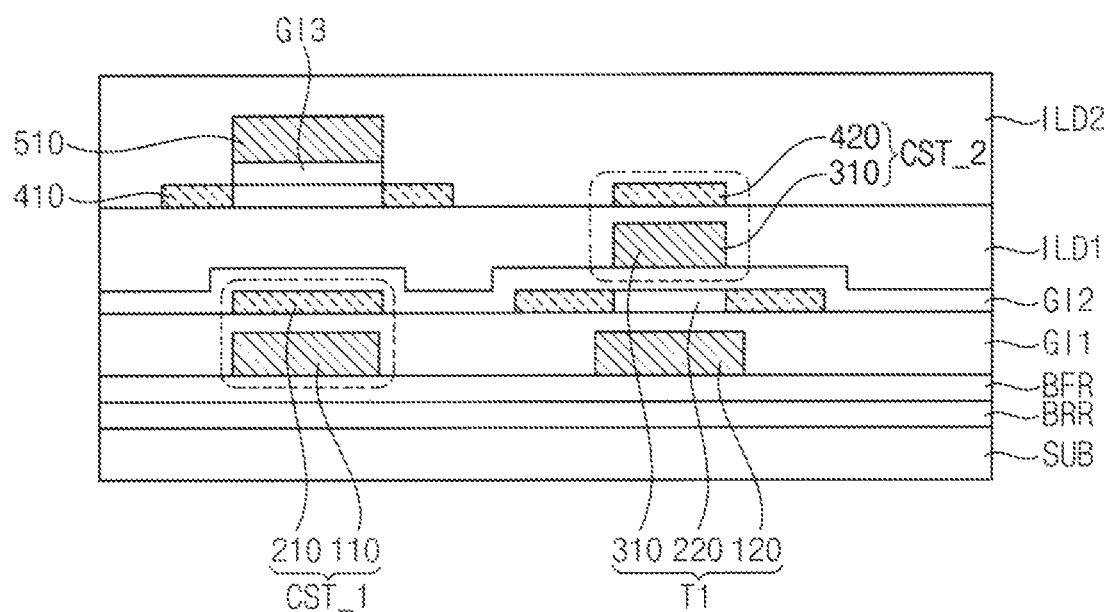

Referring to FIGS. 3, 7 and 8, the first interlayer insulating layer ILD1 may be disposed on the second gate insulating layer GI2. The first interlayer insulating layer ILD1 may cover the second lower electrode 310. In an embodiment, the first interlayer insulating layer ILD1 may include an insulating material. For example, the first interlayer insulating layer ILD1 may include silicon oxide, silicon nitride, titanium oxide, tantalum oxide, or the like.

A preliminary second active pattern 410' may be disposed on the first interlayer insulating layer ILD1. In an embodiment, the preliminary second active pattern 410' may include an oxide semiconductor. By doping the preliminary second active pattern 410', the second active pattern 410 may be formed. The preliminary second active pattern 410' may include a channel region 411', a source region 412', and a drain region 413'.

A preliminary second upper electrode 420' may be disposed on the first interlayer insulating layer ILD1 to cover the second lower electrode 310 in a plan view. In an embodiment, the preliminary second upper electrode 420' may include an oxide semiconductor. For example, the preliminary second upper electrode 420' may be formed together with the preliminary second active pattern 410' and may be disposed on the same layer as the preliminary second active pattern 410'. Accordingly, an additional process for forming an upper electrode corresponding to the first terminal C3 of the second capacitor CST_2 may be omitted.

The third gate insulating layer GI3 may be disposed on the preliminary second active pattern 410'. The third gate insulating layer GI3 may overlap the channel region 411' of the preliminary second active pattern 410'. Accordingly, the source region 412' and the drain region 413' of the preliminary second active pattern 410' may be exposed. In an embodiment, the third gate insulating layer GI3 may include an insulating material. For example, the third gate insulating layer GI3 may include silicon oxide, silicon nitride, titanium oxide, tantalum oxide, or the like.

The upper gate electrode 510 may be disposed on the third gate insulating layer GI3. In an embodiment, the upper gate electrode 510 may include a metal, an alloy, a conductive metal oxide, a transparent conductive material, or the like. For example, the upper gate electrode 510 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The second interlayer insulating layer ILD2 may be disposed on the first interlayer insulating layer ILD1. In an embodiment, the second interlayer insulating layer ILD2 may include an insulating material. For example, the second interlayer insulating layer ILD2 may include silicon oxide, silicon nitride, titanium oxide, tantalum oxide, or the like.

In an embodiment, the second interlayer insulating layer ILD2 may contact the source region 412' of the preliminary second active pattern 410' and the drain region 413' of the preliminary second active pattern 410', and the preliminary second upper electrode 420'. Hydrogen may be released from the second interlayer insulating layer ILD2. Accordingly, the hydrogen may be diffused into the source region 412' of the preliminary second active pattern 410', the drain region 413' of the preliminary second active pattern 410', and the preliminary second upper electrode 420'. The source region 412' of the preliminary second active pattern 410', the drain region 413' of the preliminary second active pattern 410', and the preliminary second upper electrode 420' may be doped. Therefore, the second active pattern 410 and the second upper electrode 420 may be formed.

Figure 9:
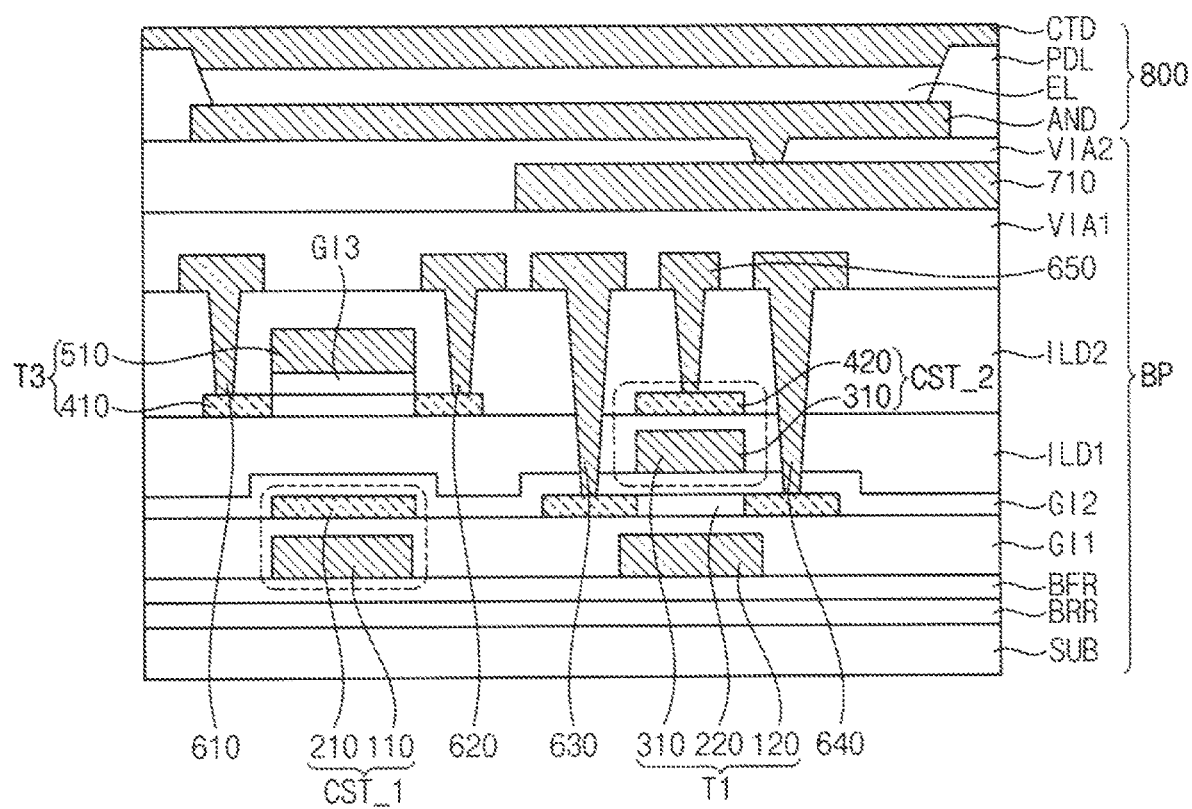

Referring to FIGS. 3 and 9, the first to fifth connection patterns 610, 620, 630, 640, and 650 may be disposed on the second interlayer insulating layer ILD2. In an embodiment, the first to fifth connection patterns 610, 620, 630, 640, and 650 may include a metal, an alloy, a conductive metal oxide, a transparent conductive material, and the like. For example, the first to fifth connection patterns 610, 620, 630, 640, and 650 may include gold ("Au"), silver ("Ag"), aluminum ("Al"), copper ("Cu"), nickel ("Ni") platinum ("Pt"), magnesium ("Mg"), chromium ("Cr"), tungsten ("W"), molybdenum ("Mo"), titanium ("Ti"), tantalum ("Ta"), and the like. In addition, the first to fifth connection patterns 610, 620, 630, 640, and 650 may have a two-layer structure of titanium/aluminum or a three-layer structure of titanium/aluminum/titanium.

For example, the first connection pattern 610 may contact the source region of the second active pattern 410. The second connection pattern 620 may contact the drain region of the second active pattern 410. The third connection pattern 630 may contact the source region of the first active pattern 220. The fourth connection pattern 640 may contact the drain region of the first active pattern 220. The fifth connection pattern 650 may contact the second upper electrode 420. For example, the fifth connection pattern 650 may transmit the high power voltage ELVDD to the second upper electrode 420.

The first via insulating layer VIA1 may be disposed on the second interlayer insulating layer ILD2. The first via insulating layer VIA1 may cover the first to fifth connection patterns 610, 620, 630, 640, and 650. In an embodiment, the first via insulating layer VIA1 may include an organic insulating material. For example, the first via insulating layer VIA1 may include a photoresist, a polyacrylic resin, a polyimide resin, an acrylic resin, or the like.

The sixth connection pattern 710 may be disposed on the first via insulating layer VIA1. In an embodiment, the sixth connection pattern 710 may include a metal, an alloy, a conductive metal oxide, a transparent conductive material, and the like. For example, the sixth connection pattern 710 may include gold ("Au"), silver ("Ag"), aluminum ("Al"), copper ("Cu"), nickel ("Ni") platinum ("Pt"), magnesium ("Mg"), chromium ("Cr"), tungsten ("W"), molybdenum ("Mo"), titanium ("Ti"), tantalum ("Ta"), and the like. In addition, the sixth connection pattern 710 may have a two-layer structure of titanium/aluminum or a three-layer structure of titanium/aluminum/titanium. The sixth connection pattern 710 may connect the drain terminal D6 of the sixth transistor T6 and the first terminal of the organic light emitting diode OLED.

The second via insulating layer VIA2 may be disposed on the first via insulating layer VIA1. The second via insulating layer VIA2 may cover the sixth connection pattern 710. In an embodiment, the second via insulating layer VIA2 may include an organic insulating material. For example, the second via insulating layer VIA2 may include a photoresist, a polyacrylic resin, a polyimide resin, an acrylic resin, or the like.

The first electrode AND may be disposed on the second via insulating layer VIA2. For example, the first electrode AND may include aluminum ("Al"), an alloy containing aluminum, silver ("Ag"), an alloy containing silver, tungsten ("W"), copper ("Cu"), an alloy containing copper, nickel ("Ni"), chromium ("Cr"), molybdenum ("Mo"), alloy containing molybdenum, titanium ("Ti"), platinum ("Pt"), tantalum ("Ta"), indium tin oxide ("ITO"), indium zinc oxide ("IZO") and the like.

The pixel defining layer PDL may be disposed on the second via insulating layer VIA2. An opening exposing an upper surface of the first electrode AND may be formed in the pixel defining layer PDL. For example, the pixel defining layer PDL may include an organic material such as a photoresist, a polyacrylic resin, a polyimide resin, or an acrylic resin.

The emission layer EL may be disposed on the first electrode AND exposed through the opening. For example, the emission layer EL may have a multilayer structure including a hole injection layer, a hole transport layer, an organic emission layer, an electron transport layer, and an electron injection layer. The organic emission layer may include an organic emission material.

The second electrode CTD may be disposed on the emission layer EL. For example, the second electrode CTD may have a plate shape. For example, the second electrode CTD may include aluminum ("Al"), an alloy containing aluminum, silver ("Ag"), an alloy containing silver, tungsten ("W"), copper ("Cu"), an alloy containing copper, nickel ("Ni"), chromium ("Cr"), molybdenum ("Mo"), alloy containing molybdenum, titanium ("Ti"), platinum ("Pt"), tantalum ("Ta"), indium tin oxide ("ITO"), indium zinc oxide ("IZO") and the like.

The pixel structure PX_1 may include the second upper electrode 420 constituting the second capacitor CST_2 together with the second lower electrode 310. Since the second upper electrode 420 is disposed on the same layer as the second active pattern 410, the second upper electrode 420 may be formed together with the second active pattern 410. Accordingly, an additional process for forming an upper electrode corresponding to the first terminal C3 of the second capacitor CST_2 may be omitted.

The pixel structure PX_1 may include the first capacitor CST_1 and the first interlayer insulating layer ILD1 having a sufficient thickness. When the thickness of the first interlayer insulating layer ILD1 is thin to ensure enough capacitance of the pixel circuit PC_1, the second active pattern 410 may be electrically affected by the electrode (e.g. the first upper electrode 210) disposed under the second active pattern 410. On the other hand, when the thickness of the first interlayer insulating layer ILD1 is thick, an amount of charge stored in the second capacitor CST_2 may be insufficient. However, since the pixel structure PX_1 includes the first interlayer insulating layer ILD1 having a sufficient thickness, the second active pattern 410 may not be electrically affected by the electrode. In addition, since the pixel structure PX_1 includes the first capacitor CST_1 and the second capacitor CST_2 connected in parallel between the high power voltage ELVDD and the first node N1, the amount of charge may be sufficiently stored.

The pixel structure PX_1 may include the first lower electrode 110 and the first upper electrode 210 constituting the first capacitor CST_1. Since the first upper electrode 210 is disposed on the same layer as the first active pattern 220, the first upper electrode 210 may be formed together with the first active pattern 220. Accordingly, an additional process for forming an upper electrode corresponding to the second terminal C2 of the first capacitor CST_1 may be omitted.

In addition, since the first lower electrode 110 is disposed on the same layer as the first lower gate electrode 120, the first lower electrode 110 may be formed together with the first lower gate electrode 120. Accordingly, the number of processes for forming the first lower electrode 110 and the first lower gate electrode 120 may be minimized. The first lower gate electrode 120 may correspond to the back-gate terminal BG1 of the first transistor T1, and accordingly, electrical characteristics of the first transistor T1 may be improved.

Figure 10:
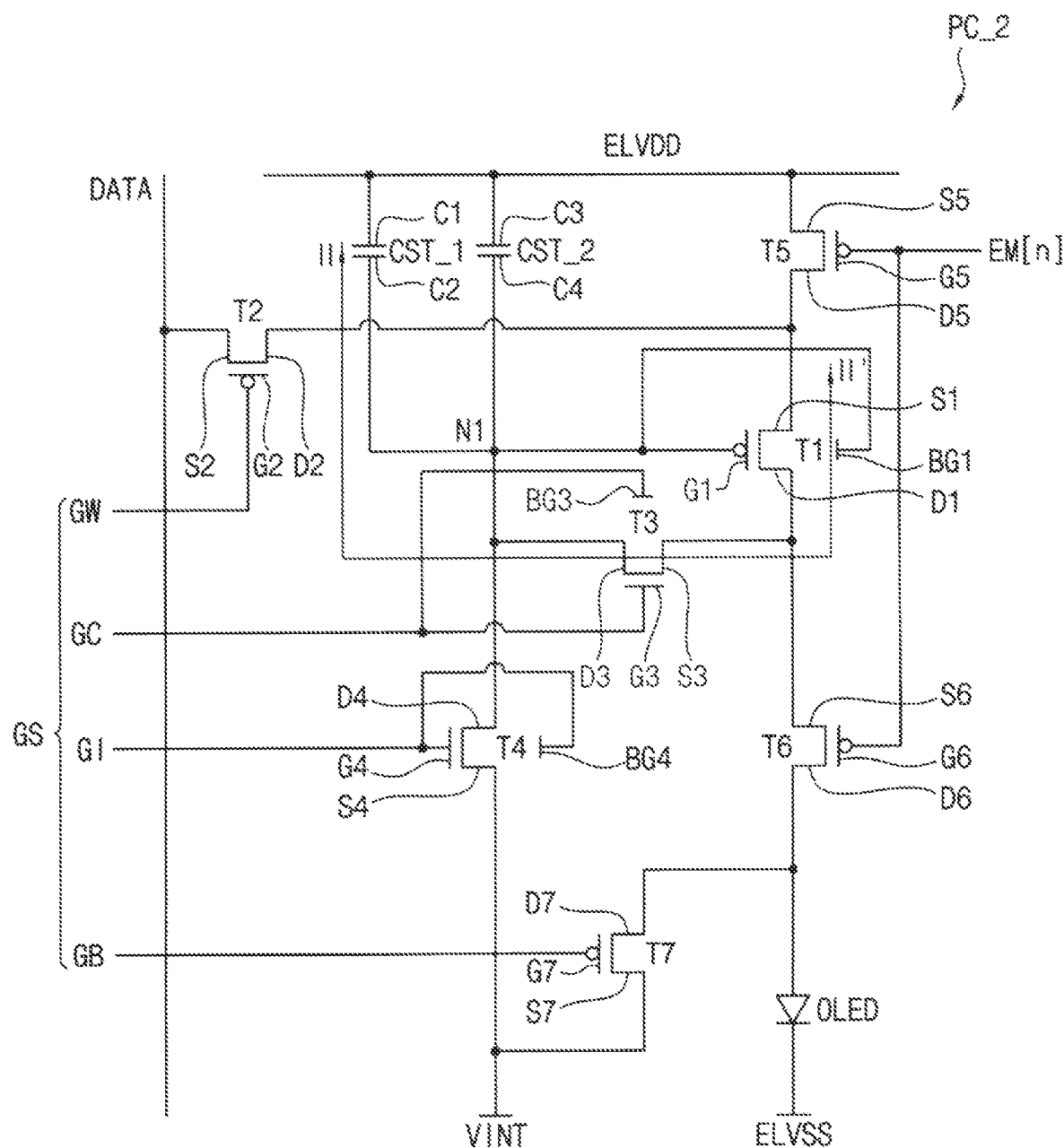
FIG. 10 is a circuit diagram illustrating another example of a pixel circuit included in the display device of FIG. 1.
Figure 11:
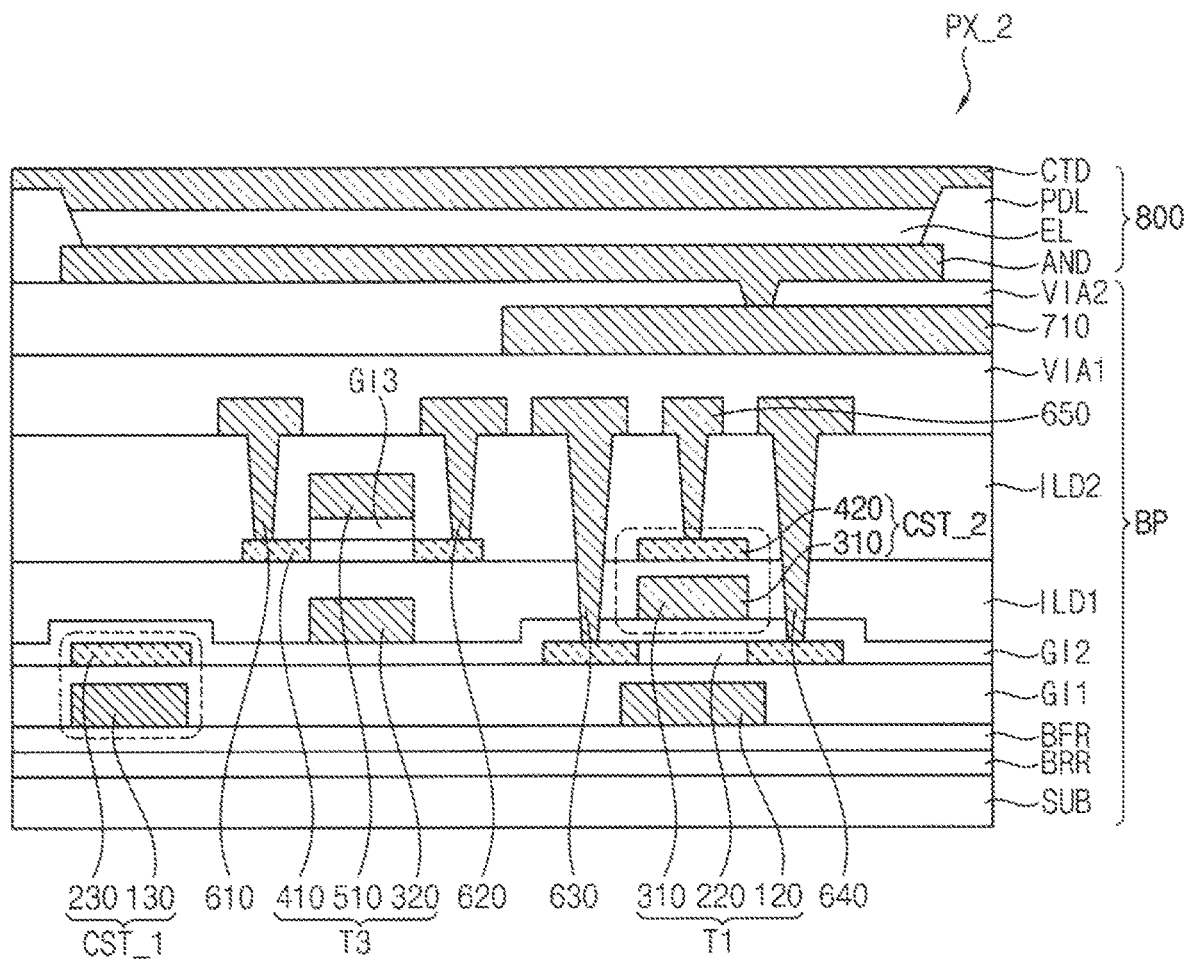
FIG. 11 is a cross-sectional view illustrating another example of a pixel structure included in the display device of FIG. 1.

FIG. 10 is a circuit diagram illustrating another example of a pixel circuit included in the display device of FIG. 1. FIG. 11 is a cross-sectional view illustrating another example of a pixel structure included in the display device of FIG. 1. For example, FIG. 11 may be a cross-sectional view taken along line II-II' of FIG. 10.

Referring to FIGS. 1 and 10, a pixel circuit PC_2 included in the display device 1000 may include a first transistor T1, a second transistor T2, a third transistor T3, a fourth transistor T4, a fifth transistor T5. a sixth transistor T6, a seventh transistor T7, a first capacitor CST_1, a second capacitor CST_2, and an organic light emitting diode OLED. However, since the second transistor T2, the fifth transistor T5, the sixth transistor T6, and the seventh transistor T7 included in the pixel circuit PC_2 is substantially the same as the second transistor T2, the fifth transistor T5, the sixth transistor T6, and the seventh transistor T7 included in the pixel circuit PC_1 described with reference to FIG. 2, descriptions thereof will be omitted for brevity.

In an embodiment, the first transistor T1 may include a source terminal S1, a drain terminal D1 connected to the organic light emitting diode OLED, a gate terminal G1 connected to a first node N1, and a back-gate terminal BG1 connected to the first node N1. The second transistor T2 may include a source terminal S2 receiving the data voltage DATA, a drain terminal D2 connected to the source terminal S1 of the first transistor T1, and a gate terminal G2 receiving a first gate signal GW. The third transistor T3 may include a source terminal S3 connected to the drain terminal D1 of the first transistor T1, a drain terminal D3 connected to the first node N1, and a gate electrode G3 receiving a second gate signal GC, and a back-gate terminal BG3 receiving the second gate signal GC. The first capacitor CST_1 may include a first terminal C1 receiving the high power voltage ELVDD and a second terminal C2 connected to the first node N1. The second capacitor CST_2 may include a first terminal C3 receiving the high power voltage ELVDD and a second terminal C4 connected to the first node N1. For example, the first capacitor CST_1 and the second capacitor CST_2 may be connected in parallel between the high power voltage ELVDD and the first node N1.

The first capacitor CST_1 may include the first terminal C1 and the second terminal C2. The first terminal C1 of the first capacitor CST_1 may be provided with the high power voltage ELVDD and the second terminal C2 of the first capacitor CST_1 may be connected to the first node N1. The first capacitor CST_1 may maintain the voltage level of the gate terminal G1 of the first transistor T1 during an inactive period of the first gate signal GW.

The second capacitor CST_2 may include the first terminal C3 and the second terminal C4. The first terminal C3 of the second capacitor CST_2 may be provided with the high power voltage ELVDD and the second terminal C4 of the second capacitor CST_2 may be connected to the first node N1. The second capacitor CST_2 may maintain the voltage level of the gate terminal G1 of the first transistor T1 during an inactive period of the first gate signal GW.

The first transistor T1 may include the gate terminal G1, the back-gate terminal BG1, the source terminal S1, and the drain terminal D1. The gate terminal G1 and the back-gate terminal BG1 of the first transistor T1 may be connected to the first node N1. Accordingly, the first transistor T1 may be implemented as a dual-gate transistor. The source terminal S1 of the first transistor T1 may be connected to the second transistor T2 to receive the data voltage DATA. The drain terminal D1 of the first transistor T1 may be connected to the organic light emitting diode OLED via the sixth transistor T6. The first transistor T1 may generate the driving current based on a voltage difference between the gate terminal G1 and the source terminal S1. For example, the first transistor T1 may be referred to as a driving transistor.

The third transistor T3 may include the gate terminal G3, the back-gate terminal BG3, the source terminal S3, and the drain terminal D3. The gate terminal G3 and the back-gate terminal BG3 of the third transistor T3 may receive the second gate signal GC. Accordingly, the third transistor T3 may be implemented as a dual-gate transistor. The source terminal S3 of the third transistor T3 may be connected to the drain terminal D1 of the first transistor T1. The drain terminal D3 of the third transistor T3 may be connected to the first node N1.

The third transistor T3 may be turned on or off in response to the second gate signal GC. For example, when the third transistor T3 is an NMOS transistor, the third transistor T3 may be turned on when the second gate signal GC has a positive voltage level and may be turned off when the gate signal GC has a negative voltage level.

During a period in which the third transistor T3 is turned on in response to the second gate signal GC, the third transistor T3 may diode-connect the first transistor T1. Since the first transistor T1 is diode-connected, the voltage difference corresponding to the threshold voltage of the first transistor T1 may occur between the gate terminal G1 of the first transistor T1 and the source terminal S1 of the first transistor T1. Accordingly, the data voltage DATA compensated by the voltage difference may be provided to the gate terminal of the first transistor T1. Therefore, the third transistor T3 may compensate for the threshold voltage of the first transistor T1. For example, the third transistor T3 may be referred to as a compensation transistor.

The fourth transistor T4 may include a gate terminal G4, a back-gate terminal BG4, a source terminal S4, and a drain terminal D4. The gate terminal G4 and the back-gate terminal BG4 of the fourth transistor T4 may receive a third gate signal GI. Accordingly, the fourth transistor T4 may be implemented as a dual-gate transistor. The source terminal S4 of the fourth transistor T4 may receive an initialization voltage VINT. The drain terminal D4 of the fourth transistor T4 may be connected to the first node N1 (the gate terminal G1 of the first transistor T1).

The fourth transistor T4 may be turned on or off in response to the third gate signal GI. For example, when the fourth transistor T4 is an NMOS transistor, the fourth transistor T4 may be turned on when the third gate signal GI has a positive voltage level and may be turned off when the gate signal GI has a negative voltage level.

During a period in which the fourth transistor T4 is turned on, the initialization voltage VINT may be provided to the gate terminal G1 of the first transistor T1. Accordingly, the fourth transistor T4 may initialize the gate terminal G1 of the first transistor T1 to the initialization voltage VINT. For example, the fourth transistor T4 may be referred to as an initialization transistor.

Meanwhile, a connection structure of the pixel circuit PC_2 shown in FIG. 10 is an example and may be variously changed. For example, the pixel circuit PC_2 may further include a boosting capacitor including a first terminal connected to the first node N1 and a second terminal receiving the first gate signal GW. The boosting capacitor may compensate for the voltage drop of the gate terminal G1 of the first transistor T1 by increasing the voltage of the gate terminal G1 of the first transistor T1 when the provision of the first gate signal GW is stopped. Alternatively, the pixel circuit PC_2 may include a seventh transistor T7 to which the anode initialization voltage is provided to the source terminal S7. The anode initialization voltage is a voltage different from the above-described initialization voltage VINT, and the first terminal of the organic light emitting diode OLED may be initialized to the anode initialization voltage.

Referring to FIGS. 1, 10, and 11, the pixel structure PX_2 may be an example of the pixel structure PX illustrated in FIG. 1. The pixel structure PX_2 may include a transistor substrate BP and an organic light emitting structure 800. The transistor substrate BP may include a base substrate, a first lower electrode 130, a first lower gate electrode 120, a first gate insulating layer GI1, a first upper electrode 230, a first active pattern 220, a second gate insulating layer GI2, a second lower electrode 310, a second lower gate electrode 320, a first interlayer insulating layer ILD1, a second active pattern 410, a second upper electrode 420, a third gate insulating layer GI3, an upper gate electrode 510, a second interlayer insulating layer ILD2, a first connection pattern 610, a second connection pattern 620, and a third connection pattern 630, a fourth connection pattern 640, a fifth connection pattern 650, a first via insulating layer VIA1, a sixth connection pattern 710, and a second via insulating layer VIA2. For example, the base substrate may include a substrate SUB, a barrier layer BRR, and a buffer layer BFR. In addition, the base substrate may have a structure in which a plurality of substrates and a plurality of barrier layers are alternately stacked. The organic light emitting structure 800 may include a first electrode AND, an emission layer EL, and a second electrode CTD.

In an embodiment, the first lower electrode 130 and the first upper electrode 230 may constitute the first capacitor CST_1. For example, the first lower electrode 130 may correspond to the first terminal C1 of the first capacitor CST_1, and the first upper electrode 210 may correspond to the second terminal C2 of the first capacitor CST_1.

In an embodiment, the second lower electrode 310 and the second upper electrode 420 may constitute the second capacitor CST_2. For example, the second lower electrode 310 may correspond to the second terminal C4 of the second capacitor CST_2 and the second upper electrode 420 may correspond to the first terminal C3 of the second capacitor CST_2.

In an embodiment, the first lower gate electrode 120, the first active pattern 220, and the second lower electrode 310 may constitute the first transistor T1. For example, the first lower gate electrode 120 may correspond to the back-gate terminal BG1 of the first transistor T1, the second lower electrode 310 may correspond to the gate terminal G1 of the first transistor T1. The first lower gate electrode 120 and the second lower gate electrode 310 may overlap each other.

In an embodiment, the second lower gate electrode 320, the second active pattern 410, and the upper gate electrode 510 may constitute the third transistor T3. For example, the second lower gate electrode 320 may correspond to the back-gate terminal BG3 of the third transistor T3, and the upper gate electrode 510 may correspond to the gate terminal G3 of the third transistor T3. The second lower gate electrode 320 and the upper gate electrode 510 may overlap each other.

In an embodiment, the first lower electrode 130 and the first upper electrode 230 may not overlap the upper gate electrode 510. In detail, the first lower electrode 130 and the first upper electrode 230 may overlap each other and the first lower electrode 130 and the upper gate electrode 510 may not overlap each other.

As described above, the first electrode AND of the organic light emitting structure 800 may correspond to the first terminal of the organic light emitting diode OLED and the second electrode CTD may correspond to the second terminal of the organic light emitting diode OLED.

FIG. 12 to FIG. 17 are cross-sectional views illustrating a method of manufacturing the pixel structure of FIG. 11.

Figure 12:
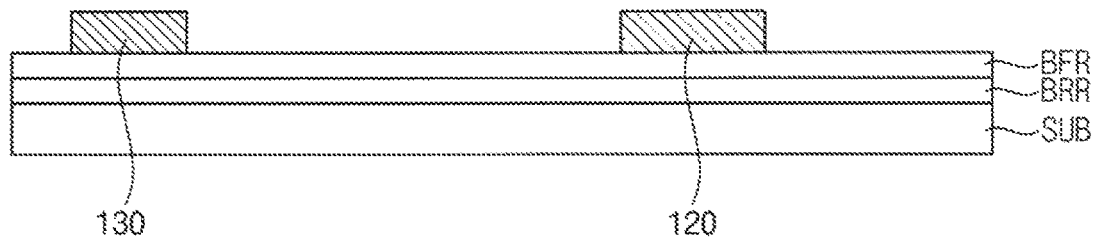
FIGS. 12, 13, 14, 15, 16 and FIG. 17 are cross-sectional views illustrating a method of manufacturing the pixel structure of FIG. 11.

Referring to FIGS. 11 and 12, the substrate SUB may include glass, quartz, plastic, or the like. In an embodiment, the substrate SUB may be a plastic substrate including plastic. For example, the plastic may be an organic material including polyimide. The barrier layer BRR may be disposed on the substrate SUB. The barrier layer BRR may include an inorganic material such as silicon oxide, silicon nitride, or amorphous silicon. The buffer layer BFR may be disposed on the barrier layer BRR. For example, the buffer layer BFR may include an inorganic material such as silicon oxide, silicon nitride, titanium oxide, tantalum oxide, and amorphous silicon. The buffer layer BFR may prevent diffusion of metal atoms or impurities from the substrate SUB into the first active pattern 220. In addition, the buffer layer BFR may control a heat transfer rate during a crystallization process for forming the first active pattern 220.

The first lower electrode 130 may be disposed on the buffer layer BFR. In an embodiment, the first lower electrode 130 may include a metal, an alloy, a conductive metal oxide, a transparent conductive material, and the like. For example, the first lower electrode 130 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The first lower gate electrode 120 may be disposed on the buffer layer BFR. For example, the first lower gate electrode 120 may be formed together with the first lower electrode 130 and may be disposed on the same layer as the first lower electrode 130. In an embodiment, the first lower gate electrode 120 may include a metal, an alloy, a conductive metal oxide, a transparent conductive material, or the like. For example, the first lower gate electrode 120 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

Since the first lower electrode 130 is disposed on the same layer as the first lower gate electrode 120, the first lower electrode 130 may be formed together with the first lower gate electrode 120. Accordingly, the number of processes for forming the first lower electrode 130 and the first lower gate electrode 120 may be minimized.

Figure 13:
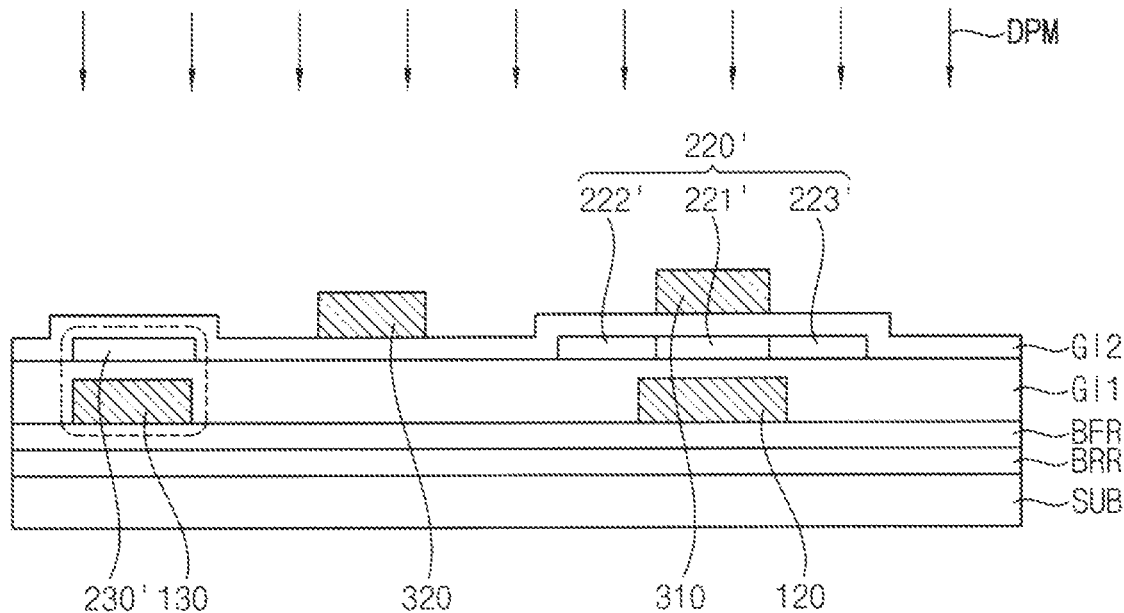
Figure 14:
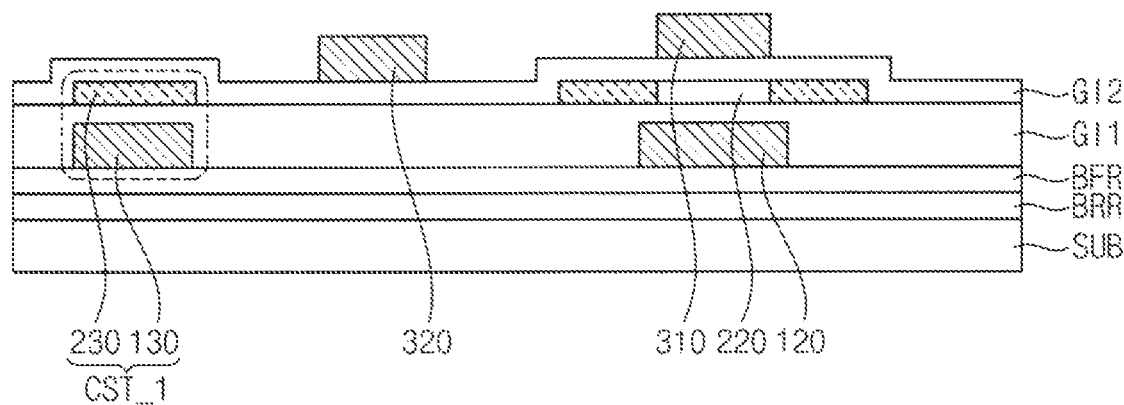

Referring to FIGS. 11, 13, and 14, the first gate insulating layer GI1 may be disposed on the buffer layer BFR. The first gate insulating layer GI1 may cover the first lower electrode 130 and the first lower gate electrode 120.

A preliminary first upper electrode 230' may be disposed on the first gate insulating layer GI. In an embodiment, the preliminary first upper electrode 230' may include a silicon semiconductor. For example, the preliminary first upper electrode 230' may include amorphous silicon, polycrystalline silicon, or the like. When the preliminary first upper electrode 230' is doped with a doping material DPM, the first upper electrode 230 may be formed.

A preliminary first active pattern 220' may be disposed on the first gate insulating layer GI. In an embodiment, the preliminary first active pattern 220' may include a silicon semiconductor such as amorphous silicon or polycrystalline silicon. For example, the preliminary first active pattern 220' may be formed together with the preliminary first upper electrode 210' and may be disposed on the same layer as the preliminary first upper electrode 210'. Accordingly, an additional process for forming an upper electrode corresponding to the second terminal C2 of the first capacitor CST_1 may be omitted.

The preliminary first active pattern 220' may include a channel region 221', a source region 222', and a drain region 223'. The doping material DPM may be selectively doped into the preliminary first active pattern 220'. For example, the source region 222' and the drain region 223' may be doped with the doping material DPM. When the preliminary first active pattern 220' is doped by the doping material DPM, the first active pattern 220 may be formed.

The second gate insulating layer GI2 may be disposed on the first gate insulating layer GI. The second gate insulating layer GI2 may cover the first upper electrode 230 and the second active pattern 220. In an embodiment, the second gate insulating layer GI2 may include an insulating material.

The second lower electrode 310 may be disposed on the second gate insulating layer GI2. In an embodiment, the second lower electrode 310 may include a metal, an alloy, a conductive metal oxide, a transparent conductive material, or the like. For example, the second lower electrode 310 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The second lower gate electrode 320 may be disposed on the second gate insulating layer GI2. For example, the second lower gate electrode 320 may be formed together with the second lower electrode 310 and may be disposed on the same layer as the second lower electrode 310. In an embodiment, the second lower gate electrode 320 may include a metal, an alloy, a conductive metal oxide, a transparent conductive material, and the like. For example, the second lower gate electrode 320 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

Since the second lower gate electrode 320 is disposed on the same layer as the second lower electrode 310, the second lower gate electrode 320 may be formed together with the second lower electrode 310. Accordingly, the number of processes for forming the second lower electrode 310 and the second lower gate electrode 320 may be minimized.

In an embodiment, the second lower electrode 310, the channel region 221', and the first lower gate electrode 120 may overlap each other. On the other hand, the first lower electrode 130 and the first upper electrode 230 may not overlap the second lower gate electrode 320. While the preliminary first upper electrode 230' and the preliminary first active pattern 220' are doped, the second lower electrode 310 and the second lower gate electrode 320 may function as a mask. For example, the channel region 221' overlapping the second lower electrode 310 may not be doped. The preliminary first upper electrode 230', the source region 222', and the drain region 223', which do not overlap with the second lower electrode 310 and the second lower gate electrode 320, may be doped.

Figure 15:
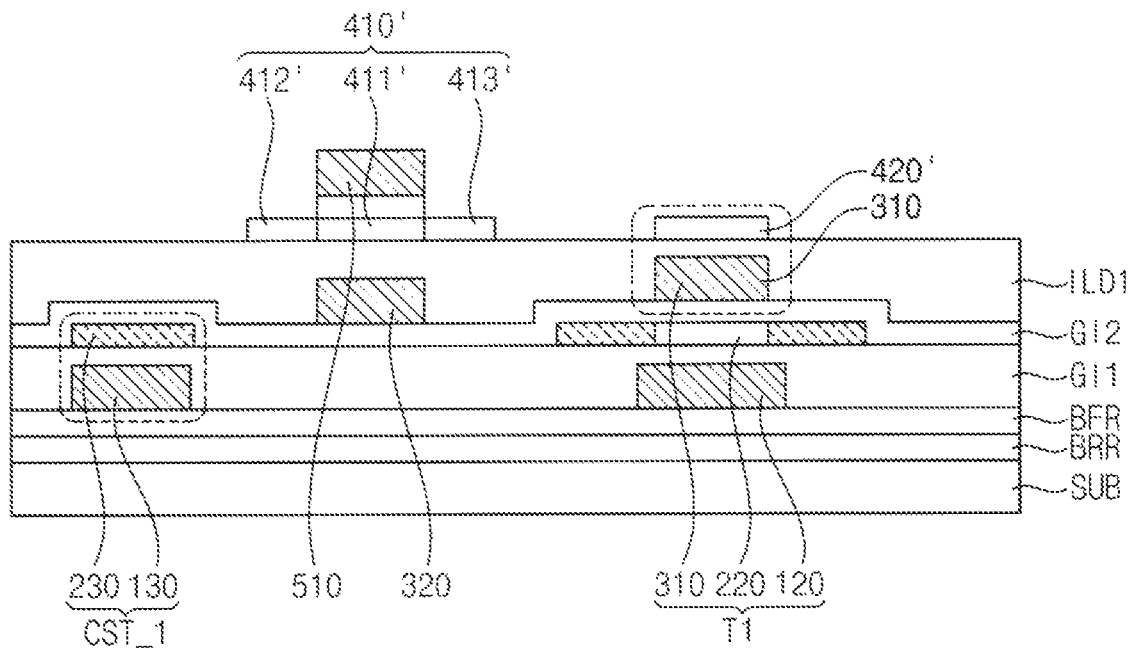
Figure 16:
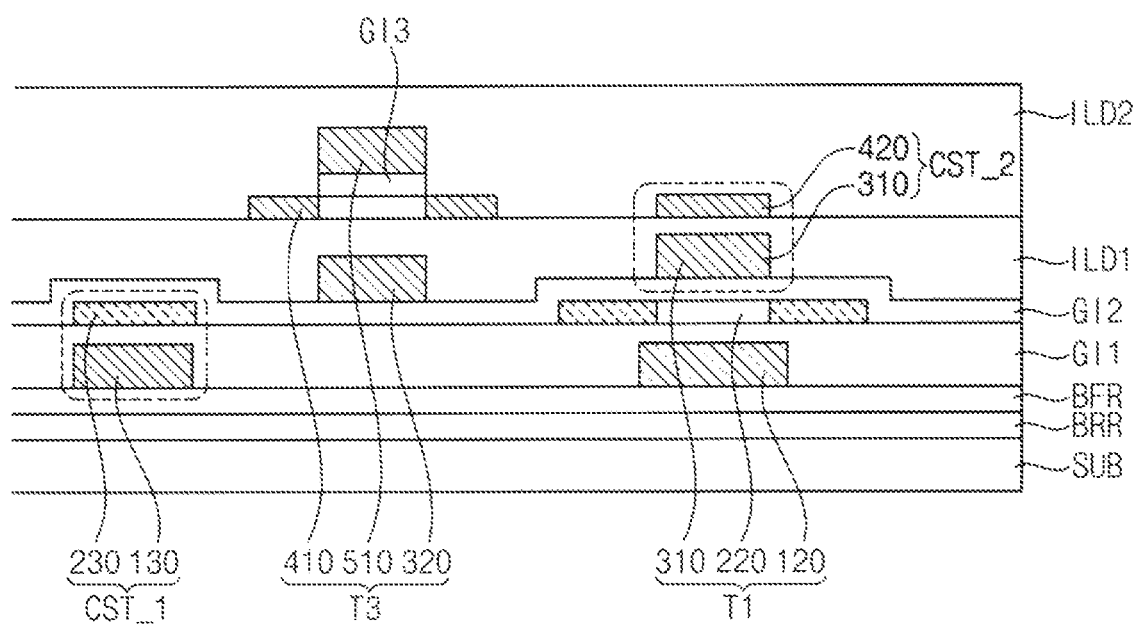

Referring to FIGS. 11, 15, and 16, the first interlayer insulating layer ILD1 may be disposed on the second gate insulating layer GI2. The first interlayer insulating layer ILD1 may cover the second lower electrode 310 and the second lower gate electrode 320. In an embodiment, the first interlayer insulating layer ILD1 may include an insulating material. For example, the first interlayer insulating layer ILD1 may include silicon oxide, silicon nitride, titanium oxide, tantalum oxide, or the like.

A preliminary second active pattern 410' may be disposed on the first interlayer insulating layer ILD1. In an embodiment, the preliminary second active pattern 410' may include an oxide semiconductor. When the preliminary second active pattern 410' is doped, the second active pattern 410 may be formed. The preliminary second active pattern 410' may include a channel region 411', a source region 412', and a drain region 413'.

A preliminary second upper electrode 420' may be disposed on the first interlayer insulating layer ILD1. In an embodiment, the preliminary second upper electrode 420' may include an oxide semiconductor. For example, the preliminary second upper electrode 420' may be formed together with the preliminary second active pattern 410' and may be disposed on the same layer as the preliminary second active pattern 410'. Accordingly, an additional process for forming an upper electrode corresponding to the first terminal C3 of the second capacitor CST_2 may be omitted.

The third gate insulating layer GI3 may be disposed on the preliminary second active pattern 410'. The third gate insulating layer GI3 may overlap the channel region 411' of the preliminary second active pattern 410'. Accordingly, the source region 412' and the drain region 413' of the preliminary second active pattern 410' may be exposed. In an embodiment, the third gate insulating layer GI3 may include an insulating material. For example, the third gate insulating layer GI3 may include silicon oxide, silicon nitride, titanium oxide, tantalum oxide, or the like.

The upper gate electrode 510 may be disposed on the third gate insulating layer GI3. In an embodiment, the upper gate electrode 510 may include a metal, an alloy, a conductive metal oxide, a transparent conductive material, or the like. For example, the upper gate electrode 510 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The second interlayer insulating layer ILD2 may be disposed on the first interlayer insulating layer ILD1. In an embodiment, the second interlayer insulating layer ILD2 may include an insulating material. For example, the second interlayer insulating layer ILD2 may include silicon oxide, silicon nitride, titanium oxide, tantalum oxide, or the like.

In an embodiment, the second interlayer insulating layer ILD2 may contact the source region 412' of the preliminary second active pattern 410', the drain region 413' of the preliminary second active pattern 410', and the preliminary second upper electrode 420'. Hydrogen may be released from the second interlayer insulating layer ILD2. Accordingly, hydrogen may be diffused into the source region 412' of the preliminary second active pattern 410', the drain region 413' of the preliminary second active pattern 410', and the preliminary second upper electrode 420'. The source region 412' of the preliminary second active pattern 410', the drain region 413' of the preliminary second active pattern 410', and the preliminary second upper electrode 420' may be doped. Therefore, the second active pattern 410 and the second upper electrode 420 may be formed.

Figure 17:
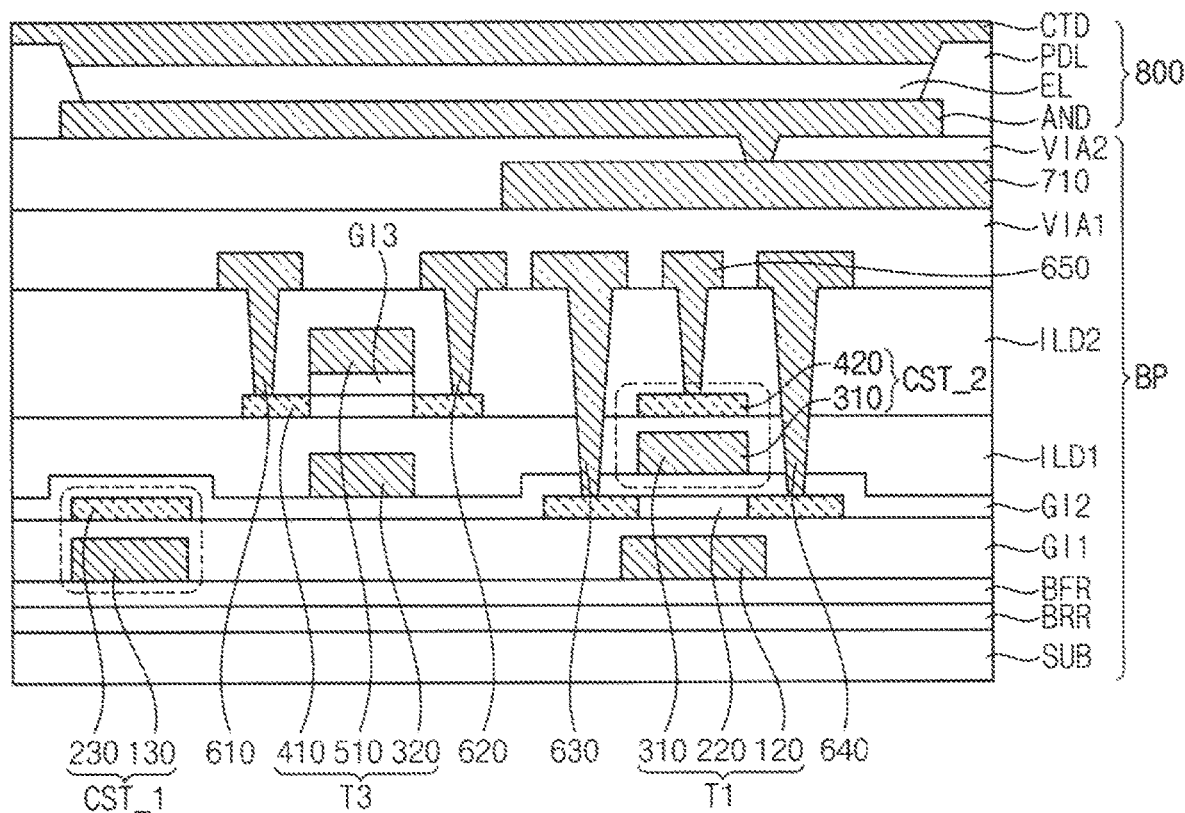

Referring to FIGS. 11 and 17, the first to fifth connection patterns 610, 620, 630, 640, and 650 may be formed on the second interlayer insulating layer ILD2, the first via insulating layer VIA1 may be formed on the second interlayer insulating layer ILD2, the sixth connection pattern 710 may be formed on the first via insulating layer VIA1, the second via insulating layer VIA2 may be formed on the first via insulating layer VIA1, the first electrode AND may be formed on the second via insulating layer VIA2, a pixel defining layer PDL may be formed on the second via insulating layer VIA2, the emission layer EL may be formed on the first electrode AND exposed through the opening of the pixel definition layer PDL, and the second electrode CTD may be formed on the emission layer EL. However, since the description thereof is substantially the same as described above, it will be omitted.

The pixel structure PX_2 may include the second upper electrode 420 constituting the second capacitor CST_2 together with the second lower electrode 310. Since the second upper electrode 420 is disposed on the same layer as the second active pattern 410, the second upper electrode 420 may be formed together with the second active pattern 410. Accordingly, an additional process for forming an upper electrode corresponding to the first terminal C3 of the second capacitor CST_2 may be omitted.

The pixel structure PX_2 may include the first capacitor CST_1 and the first interlayer insulating layer ILD1 having a sufficient thickness. When the thickness of the first interlayer insulating layer ILD1 is thin, the second active pattern 410 may be electrically affected by the electrode (e.g. the first upper electrode 230) disposed under the second active pattern 410. On the other hand, when the thickness of the first interlayer insulating layer ILD1 is thick, an amount of charge stored in the second capacitor CST_2 may be insufficient. However, since the pixel structure PX_2 includes the first interlayer insulating layer ILD1 having a sufficient thickness, the second active pattern 410 may not be electrically affected by the electrode. In addition, since the pixel structure PX_2 includes the first capacitor CST_1 and the second capacitor CST_2, the amount of charge may be sufficiently stored.

The pixel structure PX_2 may include the first lower electrode 130 and the first upper electrode 230 constituting the first capacitor CST_1. Since the first upper electrode 230 is disposed on the same layer as the first active pattern 220, the first upper electrode 230 may be formed together with the first active pattern 220. Accordingly, an additional process for forming an upper electrode corresponding to the second terminal C2 of the first capacitor CST_1 may be omitted.

In addition, since the first lower electrode 130 is disposed on the same layer as the first lower gate electrode 120, the first lower electrode 130 may be formed together with the first lower gate electrode 120. Accordingly, the number of processes for forming the first lower electrode 130 and the first lower gate electrode 120 may be minimized. The first lower gate electrode 120 may correspond to the back-gate terminal BG1 of the first transistor T1, and accordingly, electrical characteristics of the first transistor T1 may be improved. In addition, the second lower gate electrode 320 may correspond to the back-gate terminal BG3 of the third transistor T3, and accordingly, electrical characteristics of the third transistor T3 may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a first lower electrode disposed on a base substrate;
a first upper electrode disposed on the first lower electrode, overlapping the first lower electrode in a plan view, including a silicon semiconductor, and constituting a first capacitor together with the first lower electrode;
a second lower electrode disposed on the first upper electrode; and
a second upper electrode disposed on the second lower electrode, overlapping the second lower electrode in a plan view, including an oxide semiconductor, and constituting a second capacitor together with the second lower electrode,
wherein the first capacitor and the second capacitor are connected in parallel.

2. The display device of claim 1, wherein the first lower electrode and the second upper electrode are electrically connected to each other.

3. The display device of claim 1, wherein a high power voltage is provided to the first lower electrode and the second upper electrode.

4. The display device of claim 1, wherein the first upper electrode and the second lower electrode are electrically connected to each other.

5. The display device of claim 1, wherein the first lower electrode and the second lower electrode comprise a same material.

6. The display device of claim 1, further comprising:
a first active pattern disposed on a same layer as the first upper electrode and overlapping the second lower electrode in a plan view.

7. The display device of claim 6, further comprising:
a first lower gate electrode disposed on a same layer as the first lower electrode and overlapping the second lower electrode in a plan view.

8. The display device of claim 7, wherein a gate signal is provided to the first lower gate electrode and the second lower electrode.

9. The display device of claim 5, wherein the first lower electrode and the second lower electrode comprise molybdenum.

10. The display device of claim 1, further comprising:
a second active pattern disposed on a same layer as the second upper electrode; and
an upper gate electrode disposed on the second active pattern and overlapping the second active pattern in a plan view.

11. The display device of claim 10, wherein the first lower electrode and the first upper electrode overlap the upper gate electrode in a plan view.

12. The display device of claim 10, wherein the first lower electrode and the first upper electrode do not overlap the upper gate electrode in a plan view.

13. The display device of claim 12, further comprising:
a second lower gate electrode disposed on a same layer as the second lower electrode and overlapping the upper gate electrode in a plan view.

14. The display device of claim 13, wherein a gate signal is provided to the upper gate electrode and the second lower gate electrode.

15. A display device comprising:
a first lower electrode disposed on a base substrate;
an upper electrode disposed on the first lower electrode, overlapping the first lower electrode in a plan view, including a silicon semiconductor, and constituting a capacitor together with the first lower electrode;
a first active pattern disposed on a same layer as the upper electrode;
a second lower electrode disposed on the first active pattern and overlapping the first active pattern in a plan view;
a second active pattern disposed on the second lower electrode and including an oxide semiconductor; and
an upper gate electrode disposed on the second active pattern and overlapping the second active pattern in a plan view.

16. The display device of claim 15, further comprising:

a first lower gate electrode disposed on a same layer as the first lower electrode and overlapping the second lower electrode in a plan view.

17. The display device of claim 16, wherein a gate signal is provided to the second lower electrode and the first lower gate electrode.

18. The display device of claim 15, wherein the first lower electrode and the upper electrode overlap the upper gate electrode in a plan view.

19. The display device of claim 15, wherein the first lower electrode and the upper electrode do not overlap the upper gate electrode in a plan view.

20. The display device of claim 19, further comprising:
a second lower gate electrode disposed on a same layer as the second lower electrode and overlapping the upper gate electrode in a plan view.

21. The display device of claim 20, wherein a gate signal is provided to the upper gate electrode and the second lower gate electrode.

22. A display device comprising:
a first active pattern disposed on a base substrate and including a silicon semiconductor;
a lower electrode disposed on the first active pattern;
an upper electrode disposed on the lower electrode, overlapping the lower electrode in a plan view, including an oxide semiconductor, and constituting a capacitor together with the lower electrode;
a second active pattern disposed on a same layer as the upper electrode;
an upper gate electrode disposed on the second active pattern; and
a first lower electrode disposed under the first active pattern and overlapping the lower electrode in a plan view.

23. The display device of claim 22, wherein a gate signal is provided to the lower electrode and the first lower gate electrode.

24. The display device of claim 22, further comprising:
a second lower gate electrode disposed on a same layer as the lower electrode and overlapping the upper gate electrode in a plan view.

\* \* \* \* \*